(12) United States Patent
Kurokawa et al.

(10) Patent No.: US 10,985,123 B2
(45) Date of Patent: *Apr. 20, 2021

(54) SEMICONDUCTOR APPARATUS

(71) Applicant: Murata Manufacturing Co., Ltd., Kyoto (JP)

(72) Inventors: Atsushi Kurokawa, Kyoto (JP); Masayuki Aoike, Kyoto (JP); Takayuki Tsutsui, Kyoto (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/751,899

(22) Filed: Jan. 24, 2020

(65) Prior Publication Data

US 2020/0161265 A1    May 21, 2020

Related U.S. Application Data

(63) Continuation of application No. 16/210,614, filed on Dec. 5, 2018, now Pat. No. 10,580,748.

(30) Foreign Application Priority Data

Dec. 6, 2017 (JP) .............................. JP2017-234278
Jun. 19, 2018 (JP) .............................. JP2018-115798
Sep. 10, 2018 (JP) .............................. JP2018-168441

(51) Int. Cl.
*H01L 23/00* (2006.01)
*H01L 27/088* (2006.01)
(Continued)

(52) U.S. Cl.
CPC .......... *H01L 24/13* (2013.01); *H01L 21/8222* (2013.01); *H01L 21/823475* (2013.01);
(Continued)

(58) Field of Classification Search
CPC ............... H01L 24/13; H01L 29/66242; H01L 29/7371; H01L 29/7304; H01L 29/0817
See application file for complete search history.

(56) References Cited

U.S. PATENT DOCUMENTS 6,833,606 B2    12/2004  Nakamura et al.
7,514,727 B2*    4/2009  Asano ................. H01L 27/0605
                                                                 257/197

(Continued)

FOREIGN PATENT DOCUMENTS

JP    2003-77930 A    3/2003
JP    5967317 B2    8/2016

*Primary Examiner* — Changhyun Yi
(74) *Attorney, Agent, or Firm* — Pearne & Gordon LLP

(57) ABSTRACT

A first wiring is disposed above operating regions of plural unit transistors formed on a substrate. A second wiring is disposed above the substrate. An insulating film is disposed on the first and second wirings. First and second cavities are formed in the insulating film. As viewed from above, the first and second cavities entirely overlap with the first and second wirings, respectively. A first bump is disposed on the insulating film and is electrically connected to the first wiring via the first cavity. A second bump is disposed on the insulating film and is electrically connected to the second wiring via the second cavity. As viewed from above, at least one of the plural operating regions is disposed within the first bump and is at least partially disposed outside the first cavity. The planar configuration of the first cavity and that of the second cavity are substantially identical.

17 Claims, 27 Drawing Sheets

(51) Int. Cl.
*H01L 29/165* (2006.01)
*H01L 29/205* (2006.01)
*H01L 29/737* (2006.01)
*H01L 27/082* (2006.01)
*H01L 21/8234* (2006.01)
*H01L 21/8222* (2006.01)
*H03F 3/213* (2006.01)
*H03F 3/195* (2006.01)

(52) U.S. Cl.
CPC ........ *H01L 27/088* (2013.01); *H01L 27/0823* (2013.01); *H01L 29/165* (2013.01); *H01L 29/205* (2013.01); *H01L 29/7371* (2013.01); *H01L 2224/13011* (2013.01); *H01L 2224/13025* (2013.01); *H01L 2224/13147* (2013.01); *H01L 2924/351* (2013.01); *H03F 3/195* (2013.01); *H03F 3/213* (2013.01); *H03F 2200/222* (2013.01); *H03F 2200/267* (2013.01); *H03F 2200/387* (2013.01); *H03F 2200/451* (2013.01)

(56) References Cited

U.S. PATENT DOCUMENTS

| | | | |
|---|---|---|---|
| 8,426,941 B2 * | 4/2013 | Sakurai | H01L 27/088 257/508 |
| 8,686,472 B2 * | 4/2014 | Hata | H01L 21/8258 257/190 |
| 10,580,748 B2 * | 3/2020 | Kurokawa | H01L 27/0823 |
| 2005/0156194 A1 | 7/2005 | Ohbu et al. | |
| 2006/0138460 A1 | 6/2006 | Sasaki et al. | |
| 2011/0266595 A1 | 11/2011 | Hata | |
| 2016/0315060 A1 | 10/2016 | Umemoto et al. | |

* cited by examiner

FIG. 1A
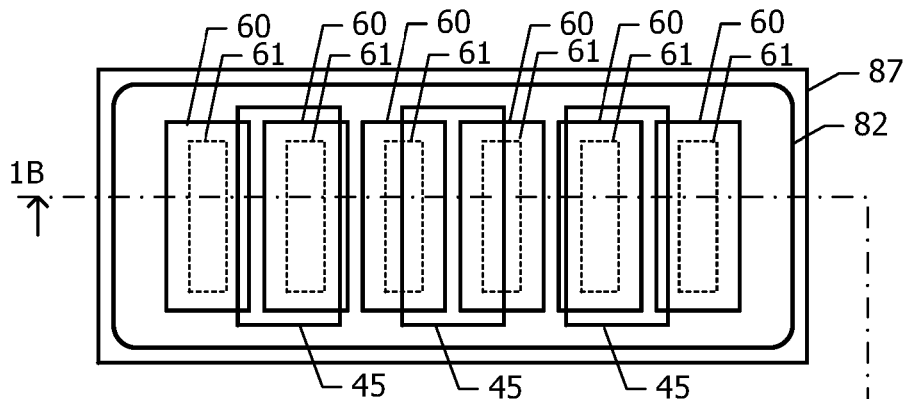
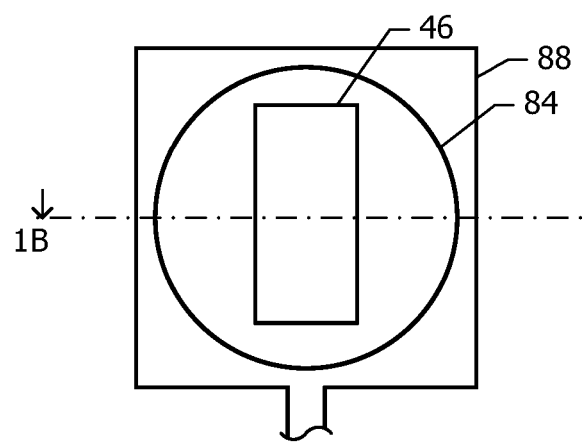
FIG. 1B
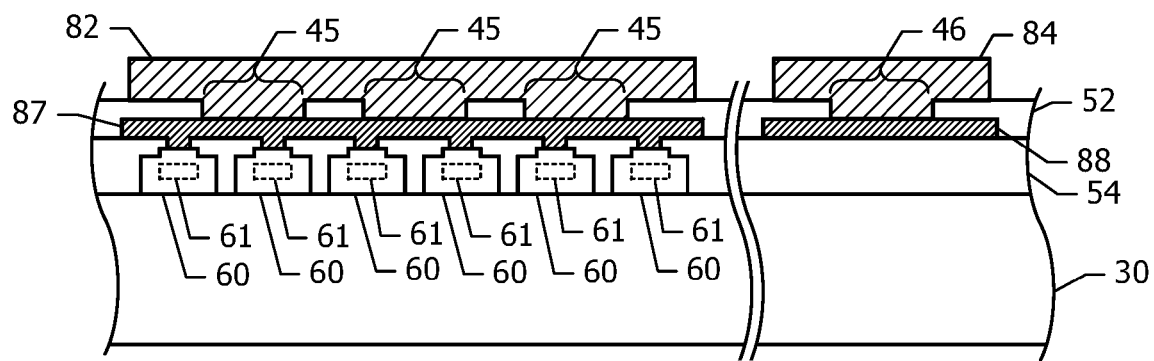

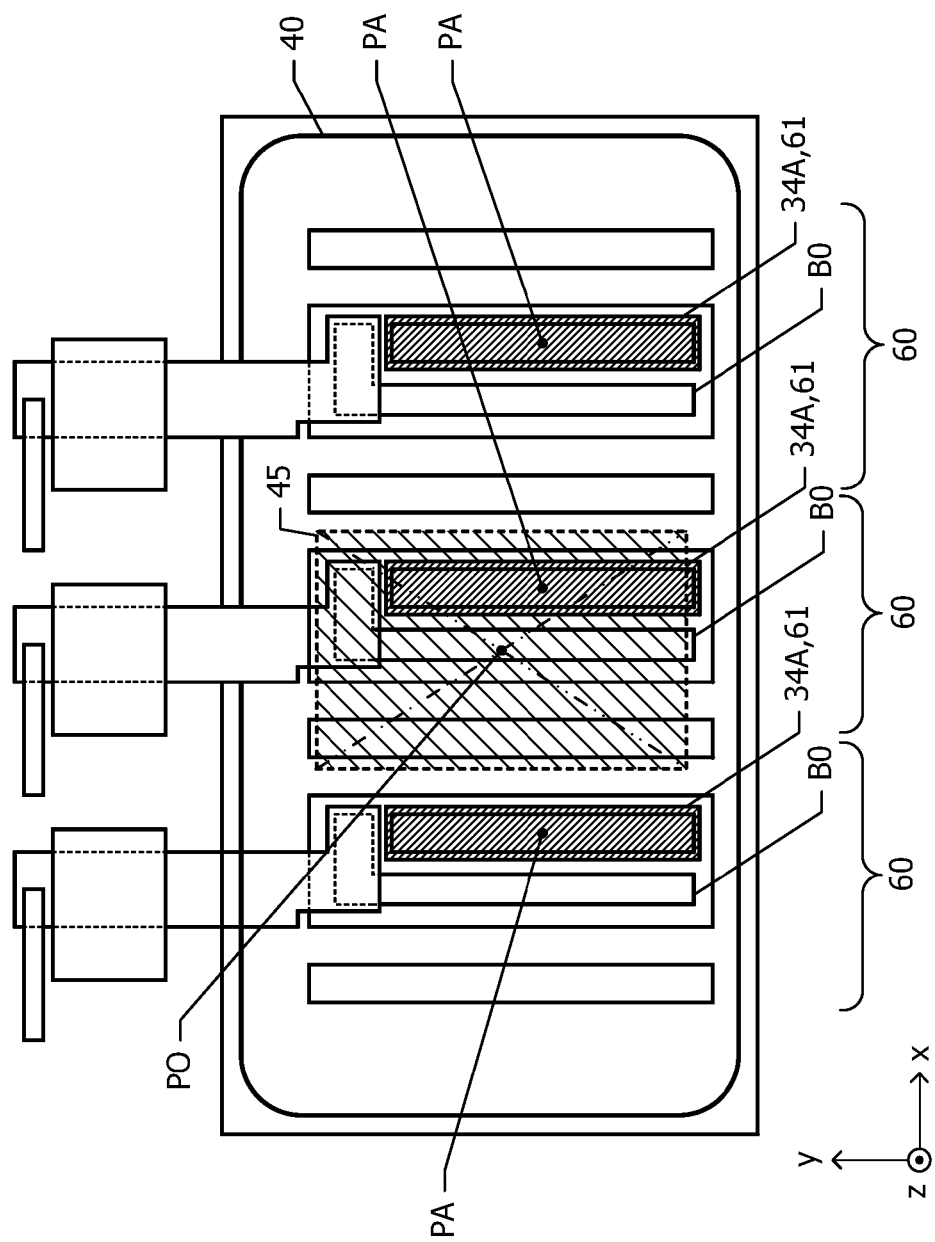

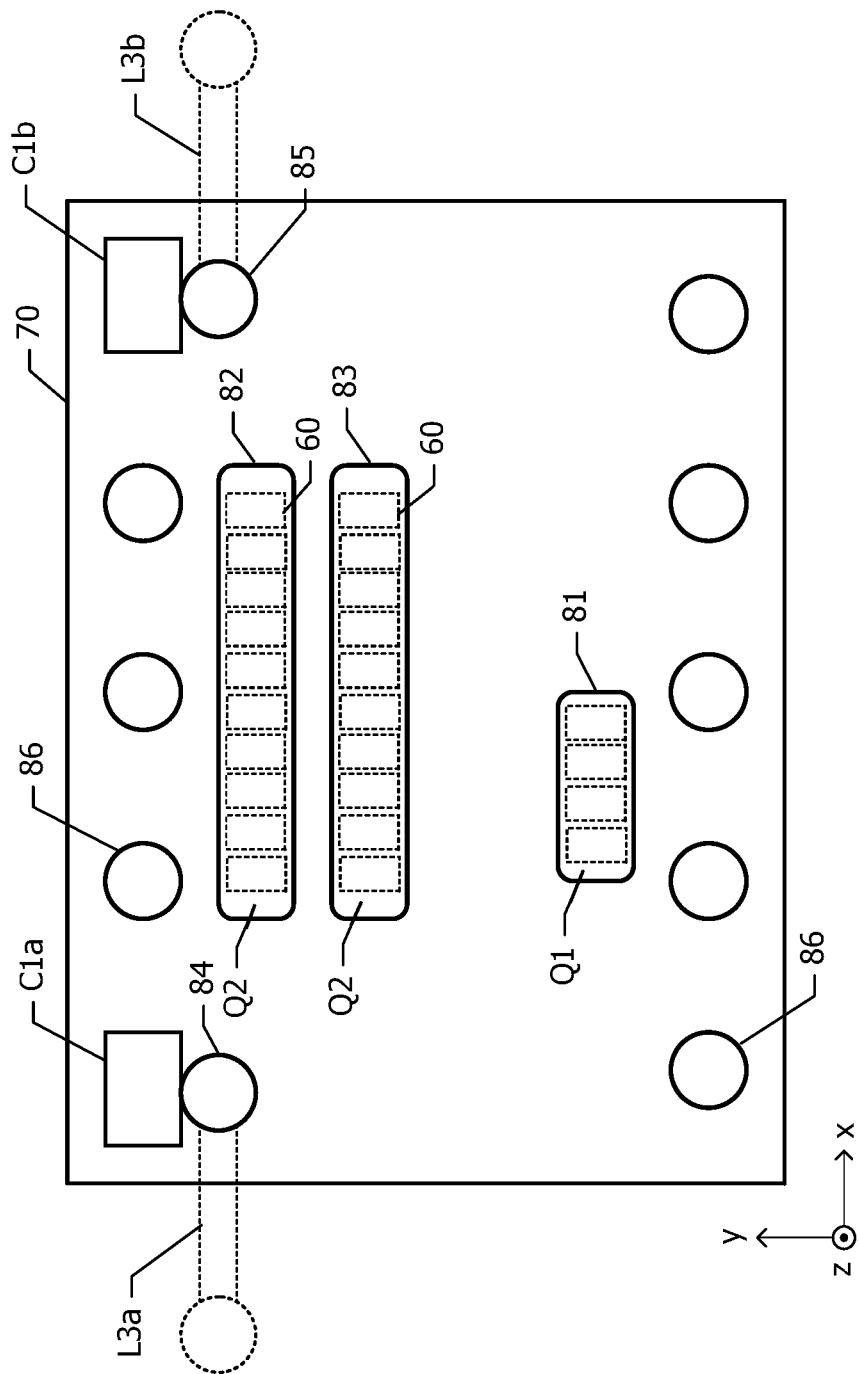

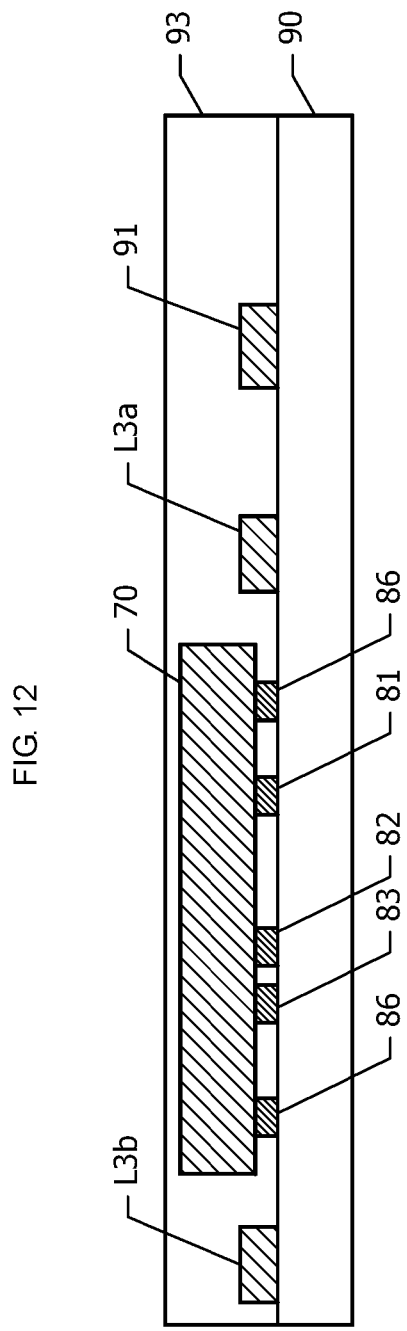

SEMICONDUCTOR APPARATUS

This is a continuation of U.S. patent application Ser. No. 16/210,614, filed on Dec. 5, 2018, which claims priority from Japanese Patent Application No. 2017-234278 filed on Dec. 6, 2017, and claims priority from Japanese Patent Application No. 2018-115798 filed on Jun. 19, 2018, and claims priority from Japanese Application No. 2018-168441 filed on Sep. 10, 2018. The content of these applications are incorporated herein by reference in their entireties.

BACKGROUND OF THE DISCLOSURE

1. Field of the Disclosure

The present disclosure relates to a semiconductor apparatus.

2. Description of the Related Art

A heterojunction bipolar transistor (HBT) is used for a power amplifier module of, for example, a mobile terminal. In the semiconductor apparatus disclosed in Japanese Unexamined Patent Application Publication No. 2003-77930, a bump is disposed immediately above an HBT. The bump is electrically connected to the HBT via a cavity formed in an insulating film disposed between the HBT and the bump. The entirety of the HBT is disposed within the cavity. With this configuration, the distance from the HBT to the bump is decreased, thereby reducing the thermal resistance in a heat path from the HBT to the bump.

This configuration, however, is likely to produce the thermal stress in the emitter layer of the HBT due to the difference between the coefficient of thermal expansion of the emitter layer and that of the bump. The occurrence of the thermal stress decreases the reliability of the HBT.

Japanese Patent No. 5967317 discloses a semiconductor apparatus that can reduce the thermal stress. In this semiconductor apparatus, the emitter layer of an HBT is formed in a substantially rectangular shape as viewed from above. A cavity formed in an insulating film under a bump is disposed at a position displaced from the emitter layer of the HBT in its longitudinal direction. This configuration makes it possible to reduce the thermal stress produced in the emitter layer to be lower than in the configuration in which the entirety of the emitter layer is disposed within the cavity.

BRIEF SUMMARY OF THE DISCLOSURE

In the semiconductor apparatus disclosed in Japanese Patent No. 5967317, the cavity is displaced from the emitter layer in its longitudinal direction, and a part of the emitter layer extends to the outside of the bump. An increased amount of deviation between the emitter layer and the cavity for the purpose of reducing the thermal stress decreases the heat dissipation. Additionally, the dimension of the transistor device is increased in the longitudinal direction of the emitter layer. This may increase the manufacturing cost.

It is an object of the present disclosure to provide a semiconductor apparatus that is capable of reducing the thermal stress produced in a transistor of the semiconductor apparatus without substantially increasing the dimensions of the transistor device or decreasing the heat dissipation.

According to an aspect of the present disclosure, there is provided a semiconductor apparatus including a plurality of unit transistors, first and second wirings, an insulating film, and first and second bumps. The plurality of unit transistors are formed on a substrate and each include an operating region through which an operating current flows. The first wiring is disposed above the operating regions of the plurality of unit transistors to serve as a path for the operating current to flow through the plurality of unit transistors. The second wiring is disposed above the substrate. The insulating film is disposed on the first and second wirings and includes at least one first cavity and a second cavity. The entirety of the at least one first cavity overlaps with the first wiring as viewed from above. The entirety of the second cavity overlaps with the second wiring as viewed from above. The first bump is disposed on the insulating film and is electrically connected to the first wiring via the at least one first cavity. The second bump is disposed on the insulating film and is electrically connected to the second wiring via the second cavity. As viewed from above, at least one of a plurality of the operating regions is disposed within the first bump. Among the at least one operating region disposed within the first bump, at least one operating region is at least partially disposed outside a corresponding one of the at least one first cavity. The planar configuration of the at least one first cavity and that of the second cavity are substantially identical.

The provision of the insulating film can reduce the thermal stress produced in the operating regions. The operating regions are disposed within the first bump as viewed from above, and thus, the dimensions of a semiconductor device are not increased. Heat is conducted from the operating regions to the first bump via the first cavity, thereby achieving sufficient heat dissipation. The planar configuration of the first cavity and that of the second cavity are substantially the same. Hence, when the first and second bumps are formed by plating, the portions of the first and second bumps embedded in the first and second cavities can be made uniform. As a result, it is possible to improve the manufacturing yield and to accordingly reduce the manufacturing cost.

Other features, elements, characteristics and advantages of the present disclosure will become more apparent from the following detailed description of preferred embodiments of the present disclosure with reference to the attached drawings.

BRIEF DESCRIPTION OF THE SEVERAL VIEWS OF THE DRAWINGS

FIG. 1A is a plan view illustrating the layout of the elements forming a semiconductor apparatus according to a first embodiment;

FIG. 1B is a sectional view taken along the long-dashed dotted line 1B-1B in FIG. 1A;

FIG. 7 is a plan view illustrating the layout of the elements forming a semiconductor apparatus according to a third embodiment;

FIG. 10 is a plan view illustrating the layout of the devices on a semiconductor chip forming the semiconductor apparatus according to the fourth embodiment;

FIG. 12 is a sectional view of the semiconductor apparatus according to the fourth embodiment;

DETAILED DESCRIPTION OF THE DISCLOSURE

First Embodiment

Figure 2:
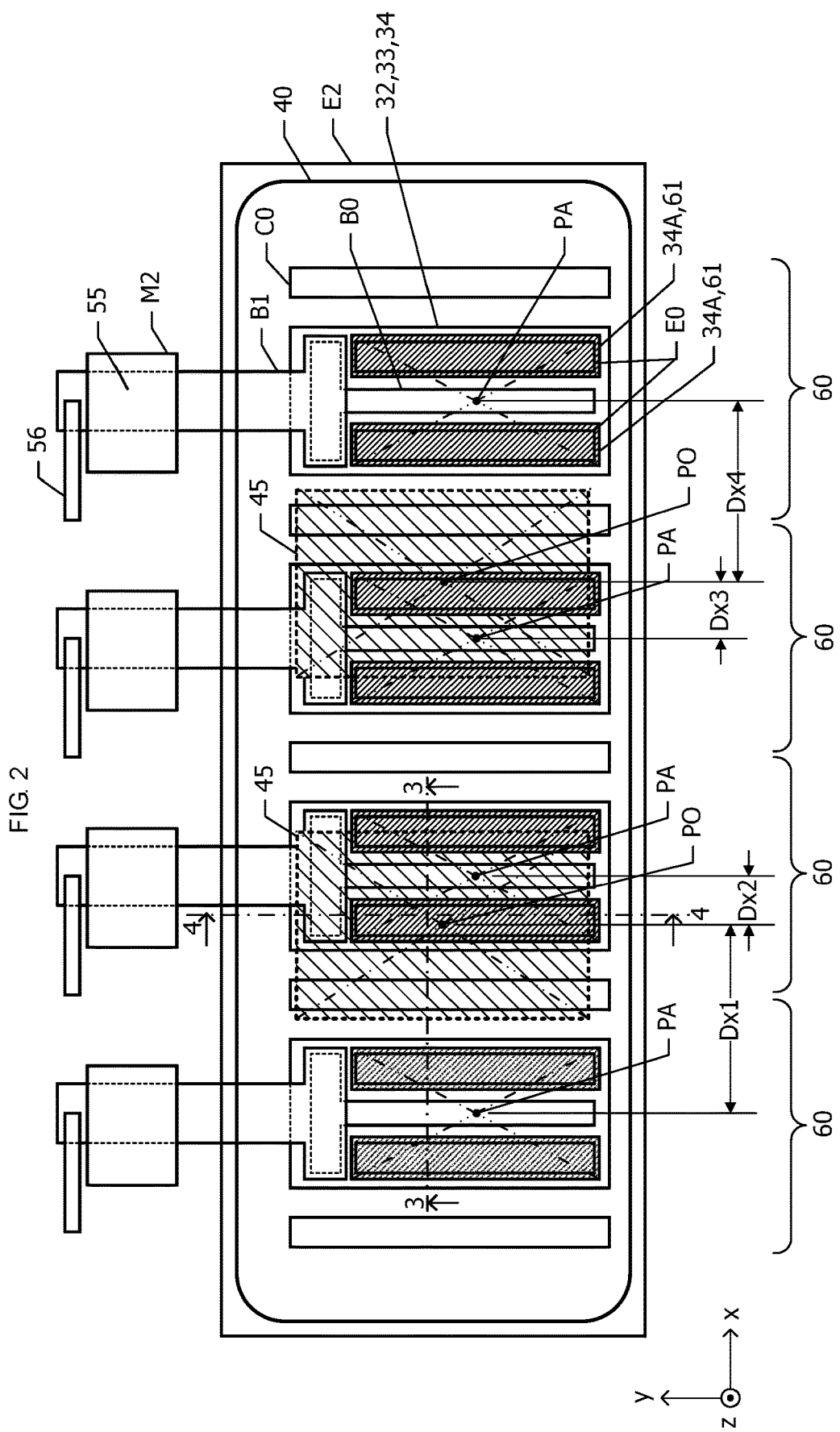
FIG. 2 is a plan view illustrating the layout of the elements forming a semiconductor apparatus according to a second embodiment.

A semiconductor apparatus according to a first embodiment will be described below with reference to FIGS. 1A and 1B.

FIG. 1A is a plan view illustrating the layout of the elements forming the semiconductor apparatus according to the first embodiment. FIG. 1B is a sectional view taken along the long-dashed dotted line 1B-1B in FIG. 1A.

On a substrate 30 (FIG. 1B), plural (six, for example) unit transistors 60 are formed. The unit transistors 60 each include an operating region 61 through which an operating current flows. The unit transistor 60 includes a collector layer, a base layer, and an emitter layer stacked on each other in this order. The region where the emitter current and the collector current substantially flow can be called the operating region 61.

An insulating film 54 is disposed on the substrate 30 so as to cover the unit transistors 60. A wiring 87 (first wiring) is disposed above the operating regions 61 via the insulating film 54. The term "above" suggests that the wiring 87 is not in direct contact with the operating regions 61 and is located at a higher level than the operating regions 61. The wiring 87 is connected to the unit transistors 60 via cavities formed in the insulating film 54 and serves as a path for a current to flow through the unit transistors 60. In addition to the wiring 87, a wiring 88 (second wiring) is disposed on the insulating film 54. The wiring 88 is connected to transistors, for example, formed on the substrate 30 other than the unit transistors 60.

Another insulating film 52 is disposed on the insulating film 54, the wiring 87, and the wiring 88. At least one cavity 45 (first cavity) (three in the example in FIG. 1B) and at least one cavity 46 (second cavity) (one in the example in FIG. 1B) are provided in the insulating film 52. The entirety of each of the cavities 45 overlaps with the wiring 87, as viewed from above. The entirety of the cavity 46 overlaps with the wiring 88, as viewed from above. As viewed from above, the cavities 45 do not overlap with the wiring 88, and the cavity 46 does not overlap with the wiring 87.

On the insulating film 52, a pillar bump 82 (first bump) and a pillar bump 84 (second bump) are disposed. The planar configuration of the pillar bump 82 is substantially a rectangle, and that of the pillar bump 84 is substantially a circle. The pillar bump 82 is electrically connected to the wiring 87 via the cavities 45, while the pillar bump 84 is electrically connected to the wiring 88 via the cavity 46. As shown in the plan view of FIG. 1A, the cavities 45 are disposed within the rectangular pillar bump 82, and the cavity 46 is disposed within the circular pillar bump 84.

As viewed from above, among the plural operating regions 61, at least one operating region 61 is disposed within the pillar bump 82. In the first embodiment shown in FIG. 1A, all the operating regions 61 are disposed within the pillar bump 82, as viewed from above. Among the operating regions 61 disposed within the pillar bump 82, at least one operating region 61 is at least partially disposed outside the corresponding cavity 45. In the first embodiment shown in FIG. 1A, each of the third and fourth operating regions 61 from the left is partially disposed outside the corresponding cavity 45. The second and fifth operating regions 61 from the left are entirely disposed within the corresponding cavities 45. The operating regions 61 at both ends are entirely disposed outside the corresponding cavities 45.

Advantages achieved by the configuration of the semiconductor apparatus according to the first embodiment will be discussed below.

In the first embodiment, the provision of the insulating layer 52 can reduce the thermal stress in the operating regions 61 produced due to the difference between the coefficient of thermal expansion of the pillar bump 82 and that of the substrate 30 and that of the unit transistors 60. The operating regions 61 are disposed within the pillar bump 82 as viewed from above. This makes the dimensions of a transistor device smaller than those in the configuration in which the operating regions 61 extend to the outside of the pillar bump 82.

Heat can be conducted from the operating regions 61 to the pillar bump 82 via the cavities 45, thereby achieving sufficient heat dissipation. Additionally, the planar configurations of the cavities 45 and 46 are substantially the same. Hence, when the pillar bumps 82 and 84 are formed by plating, the portions of the pillar bumps 82 and 84 embedded in the cavities 45 and 46 can be made uniform. It is thus possible to improve the manufacturing yield and to accordingly reduce the manufacturing cost.

Second Embodiment

A semiconductor apparatus according to a second embodiment will be described below with reference to FIGS. 2 through 6B.

Figure 3:
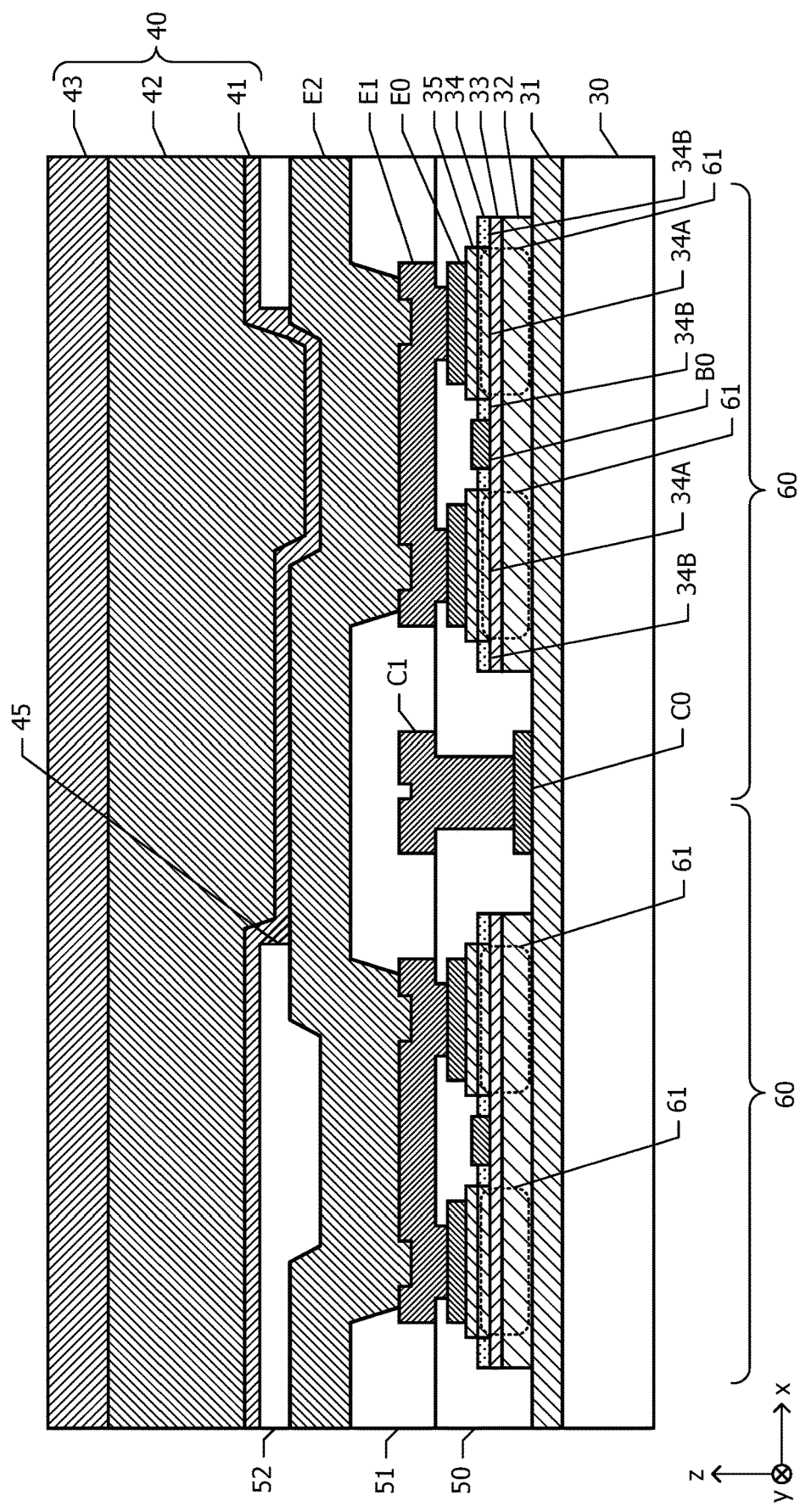
FIG. 3 is a sectional view taken along the long-dashed dotted line 3-3 in FIG. 2.
Figure 4:
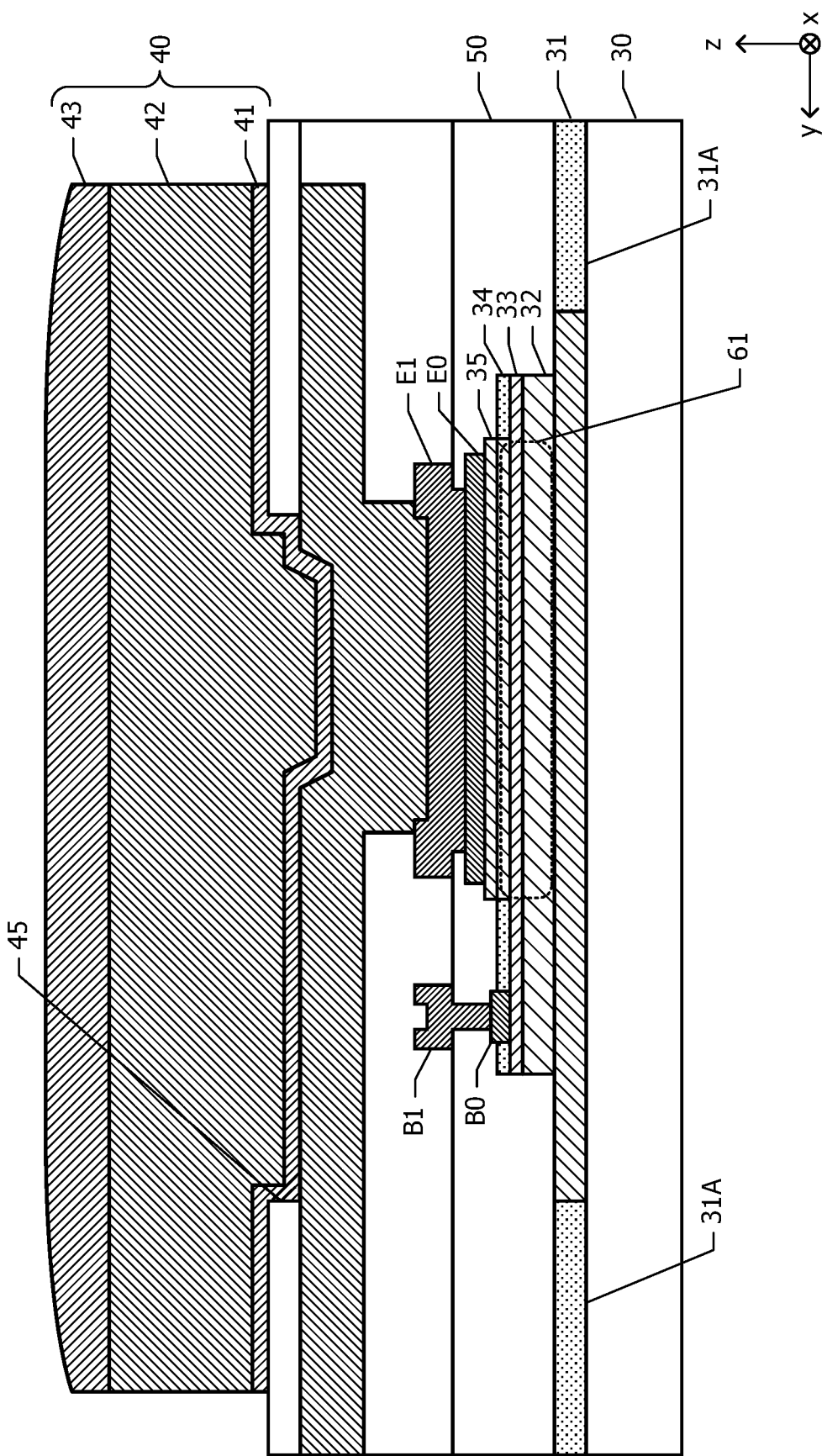
FIG. 4 is a sectional view taken along the long-dashed dotted line 4-4 in FIG. 2.

FIG. 2 is a plan view illustrating the layout of the elements forming the semiconductor apparatus according to the second embodiment. FIG. 3 is a sectional view taken along the long-dashed dotted line 3-3 in FIG. 2. FIG. 4 is a sectional view taken along the long-dashed dotted line 4-4 in FIG. 2. The semiconductor apparatus is constituted by plural elements stacked on each other. To make it easy to differentiate the elements of the semiconductor apparatus, some elements located on the lower side and hidden under the elements on the upper side are indicated by the broken lines, though they are not actually seen from above in FIG. 2. The outer edges of some elements are indicated by the broken lines, and some elements are indicated by the hatched portions with different densities.

In the drawings, an xyz rectangular coordinate system is defined. In this coordinate system, the horizontal direction of the semiconductor apparatus in FIG. 2 is set as the x-axis direction, the vertical direction is set as the y-axis direction, and the direction perpendicular to the plane of the drawing is set as the z-axis direction. Plural unit transistors 60 (four transistors 60 in the second embodiment in FIG. 2) are arranged in the x-axis direction. The plural unit transistors 60 are connected in parallel with each other by wiring on an upper layer.

Each of the unit transistors 60 includes a collector layer 32, a base layer 33, and an emitter layer 34, a collector electrode C0, a base electrode B0, and two emitter electrodes E0. Portions of the emitter layer 34 that contribute to the operation of an HBT (where an emitter current substantially flows) will be called emitter regions 34A. The two emitter electrodes E0 are disposed within the respective two emitter regions 34A, as viewed from above. The two emitter regions 34A are each formed in a substantially rectangular shape elongated in the y-axis direction, as viewed from above, and are located with a space therebetween in the x-axis direction. The main portion of the base electrode B0 is disposed between the two emitter regions 34A. The operating current flows in the thickness direction (z-axis direction) of the emitter regions 34A, which will be discussed later with reference to FIG. 3. The portions located within the emitter regions 34A in a plan view serve as the operating regions 61 of each unit transistor 60. The operating regions 61 serve as a major heating source. In FIG. 2, the operating regions 61 are indicated by the hatched portions with high-density right-downward lines.

The emitter regions 34A and the base electrode B0 are disposed within the base layer 33, as viewed from above. The base electrode B0 has a portion (connecting portion) extending from one end of the main portion (positive side of the y axis in FIG. 2) toward both sides in parallel with the x-axis direction. A first-layer base wiring B1 is connected to this connecting portion of the base electrode B0. The first-layer base wiring B1 partially overlaps with a second-layer wiring M2. A capacitor 55 is formed in this overlapping portion. The first-layer base wiring B1 is connected to a ballast resistor 56.

The collector electrode C0 is disposed at both sides of the base layer 33 in the x-axis direction. Two adjacent unit transistors 60 use the same collector electrode C0 disposed between the base layers 33 of the unit transistors 60.

A second-layer emitter wiring E2 is disposed above the emitter layer 34. The second-layer emitter wiring E2 contains the four unit transistors 60 therein as viewed from above, and serves as wiring for the operating current to flow through the unit transistors 60. The second-layer emitter wiring E2 is electrically connected to the emitter electrodes E0 with a first-layer emitter wiring E1 (see FIGS. 3 and 4) interposed therebetween.

A pillar bump (metal member) 40 is formed to overlap with the second-layer emitter wiring E2, as viewed from above. The pillar bump 40 is electrically connected to the second-layer emitter wiring E2 via plural cavities 45 formed in an insulating film located immediately under the pillar bump 40. In FIG. 2, the cavities 45 are indicated by the hatched portions with low-density right-upward lines.

The dimensions of each of the emitter regions 34A are about 2 to 8 μm in the x-axis direction (width) and about 10 to 40 μm in the y-axis direction (length). The dimensions of the pillar bump 40 are about 70 to 500 μm in the x-axis direction (width) and about 60 to 100 μm in the y-axis direction (length). The width (x-axis direction) of each of the cavities 45 is about 10 to 60 μm.

As shown in FIG. 3, a sub-collector layer 31 made of high-concentration n-type GaAs is formed on a substrate 30 made of semi-insulating GaAs. The thickness of the sub-collector layer 31 is about 0.5 μm.

Multiple mesas are formed on the sub-collector layer 31. Each mesa is constituted by the collector layer 32, the base layer 33, and the emitter layer 34 stacked on each other. One mesa corresponds to one unit transistor 60 (FIG. 2). Two emitter mesa layers 35 are disposed on the emitter layer 34 so as to be separated from each other in the x-axis direction. The portions of the emitter layer 34 located immediately under the emitter mesa layers 35 operate as the emitter regions 34A where the operating current flows in the thickness direction. The portions of the emitter layer 34 on which the emitter mesa layers 35 are not provided are depleted and are called ledge layers 34B. The ledge layers 34B serve as protection layers for reducing the occurrence of the electron hole recombination on the surface of the base layer 33.

The collector layer 32 is formed of n-type GaAs, for example, and has a thickness of about 1 µm. The base layer 33 is formed of p-type GaAs, for example, and has a thickness of about 100 nm. The emitter layer 34 is formed of n-type InGaP, for example, and has a thickness of about 30 to 40 nm. The interface between the emitter layer 34 and the base layer 33 forms a heterojunction. The emitter mesa layers 35 are each formed in a double-layer structure constituted by a high-concentration n-type GaAs layer having a thickness of about 100 nm and a high-concentration n-type InGaAs layer having a thickness of about 100 nm.

The emitter electrodes E0 are disposed on the respective emitter mesa layers 35. A Ti film having a thickness of about 50 nm, for example, is used for the emitter electrodes E0. The emitter electrodes E0 are connected to the emitter mesa layers 35 based on ohmic connection.

A cavity is formed in the ledge layer 34B in a region sandwiched between the two emitter mesa layers 35. The base electrode B0 is disposed within this cavity. The base electrode B0 is connected to the base layer 33 based on ohmic connection. The base electrode B0 is constituted by a Ti film, a Pt film, and an Au film stacked on each other in this order.

A collector electrode C0 is disposed on the sub-collector layer 31 between two mesas, each of which is constituted by the collector layer 32, the base layer 33, and the emitter layer 34. The collector electrode C0 is constituted by an AuGe film, a Ni film, and an Au film stacked on each other in this order. The collector electrode C0 is connected to the sub-collector layer 31 based on ohmic connection. Two adjacent unit transistors 60 use the same collector electrode C0 disposed therebetween. The sub-collector layer 31 serves as a current path which connects the collector electrode C0 and the collector layer 32.

A first-layer insulating film 50 is formed to cover the mesa including the collector layer 32, the base layer 33, and the emitter layer 34, the emitter mesa layers 35, the emitter electrodes E0, the base electrode B0, and the collector electrode C0. A single SiN film or a multilayer film of a SiN film and a resin film, for example, is used for the first-layer insulating film 50.

On the first-layer insulating film 50, the first-layer emitter wiring E1 and a first-layer collector wiring C1 are disposed. The first-layer emitter wiring E1 is electrically connected to the emitter electrodes E0 via cavities formed in the first-layer insulating film 50. The first-layer collector wiring C1 is electrically connected to the collector electrode C0 via a cavity formed in the first-layer insulating film 50. The first-layer emitter wiring E1 and the first-layer collector wiring C1 each have a multilayer structure constituted by a Ti film having a thickness of about 50 nm and an Au film having a thickness of about 1 µm stacked on each other in this order.

A second-layer insulating film 51 is formed on the first-layer insulating film 50 to cover the first-layer emitter wiring E1 and the first-layer collector wiring C1. A single SiN film or a multilayer film of a SiN film and a resin film, for example, is used for the second-layer insulating film 51. The second-layer emitter wiring E2 is disposed on the second-layer insulating film 51. The second-layer emitter wiring E2 is constituted by a Ti film having a thickness of about 50 nm and an Au film having a thickness of about 4 µm stacked on each other in this order. The second-layer emitter wiring E2 is connected to the first-layer emitter wiring E1 via a cavity formed in the second-layer insulating film 51. The first-layer emitter wirings E1 disposed for the respective unit transistors 60 are connected to each other via the second-layer emitter wiring E2.

A third-layer insulating film 52 is formed to cover the second-layer emitter wiring E2. A single SiN film or a multilayer film of a SiN film and a resin film, for example, is used for the third-layer insulating film 52. Plural cavities 45 (only one cavity 45 is shown in FIG. 3) are formed in the third-layer insulating film 52. As shown in FIG. 2, the plural cavities 45 are located within the second-layer emitter wiring E2, as viewed from above. The second-layer emitter wiring E2 extends until the bottom surfaces of the cavities 45.

The pillar bump (metal member) 40 is disposed on the third-layer insulating film 52. The pillar bump 40 includes an under bump metal layer 41, which is the bottommost layer, a metal post 42, which is the intermediate layer, and a solder layer 43, which is the topmost layer, in this order. The pillar bump 40 is electrically connected to the second-layer emitter wiring E2 via the cavities 45.

A Ti film having a thickness of about 100 nm, for example, may be used for the under bump metal layer 41. The under bump metal layer 41 serves to enhance the adhesiveness of the pillar bump 40 to the third-layer insulating film 52. A metal material containing copper as a main constituent, for example, may be used for the metal post 42. A Cu film having a thickness of about 20 to 50 µm, for example, may be used as the metal post 42. A Sn film having a thickness of 30 µm, for example, may be used for the solder layer 43. A mutual-diffusion-preventing barrier metal layer may be disposed between the metal post 42 and the solder layer 43. Ni, for example, may be used for this barrier metal layer.

In each of the unit transistors 60, a large number of electrons are implanted from the emitter regions 34A into the base layer 33. Most of the electrons implanted into the base layer 33 are transported mainly in the thickness direction of the collector layer 32 and reach the sub-collector layer 31. At this time, Joule heating occurs due to a voltage drop in the base layer 33 and the collector layer 32. The portions of the emitter layer 34, the base layer 33, and the collector layer 32 immediately under the emitter mesa layers 35 operate as the operating regions 61 and generate heat. As viewed from above, the outer edge lines of the operating regions 61 coincide with those of the emitter mesa layers 35.

The configuration of the semiconductor apparatus that is not shown in the sectional view of FIG. 3 will be discussed below with reference to FIG. 4. Because of the increased resistance of a part of the sub-collector layer 31, an isolation region 31A is formed. In this specification, the sub-collector layer 31 is a region other than the isolation region 31A. A mesa constituted by the collector layer 32, the base layer 33, and the emitter layer 34 is disposed on the sub-collector layer 31 surrounded by the isolation region 31A.

The first-layer base wiring B1 is disposed on the first-layer insulating film 50. The first-layer base wiring B1 is electrically connected to the base electrode B0 via a cavity formed in the first-layer insulating film 50.

The positional relationships among the pillar bump 40, the cavities 45, and the operating regions 61 will be discussed below. For each unit transistor 60, the centroid PA (FIG. 2) of the operating regions 61 is defined. The centroid PA corresponds to the center of gravity of the two operating regions 61 included in each unit transistor 60. That is, focusing on one unit transistor 60, the area of the operating region 61 on the positive side of the x axis with respect to the centroid PA is equal to that on the negative side of the x axis. The area of the operating region 61 on the positive side of the y axis with respect to the centroid PA is equal to that on the negative side of the y axis. In this specification, the centroid of the two operating regions 61 included in one unit transistor 60 will simply be called the centroid PA of the operating region 61.

The centroid PO of each cavity 45 is defined. The centroid PO corresponds to the center of gravity of each cavity 45. If the planar configuration of the cavity 45 is substantially a rectangle, the centroid PO coincides with the point of the intersection of the two diagonal lines of the rectangle.

The plural unit transistors 60 are arranged side by side in the x-axis direction (direction perpendicular to the longitudinal direction of the operating region 61). The plural cavities 45 are also arranged side by side in the x-axis direction. The centroid PO of each cavity 45 is displaced from the centroid PA of the operating region 61 in the x-axis direction.

The amount of deviation between the centroid PA of the operating region 61 of the unit transistor 60 positioned at the left end in the x-axis direction and the centroid PO of the cavity 45 positioned most adjacent to this unit transistor 60 is indicated by Dx1. The amount of deviation between the centroid PA of the operating region 61 of the unit transistor 60 positioned at the right end in the x-axis direction and the centroid PO of the cavity 45 positioned most adjacent to this unit transistor 60 is indicated by Dx4. The amount of deviation between the centroid PA of the operating region 61 of the second unit transistor 60 from the left end and the centroid PO of the cavity 45 positioned most adjacent to this unit transistor 60 is indicated by Dx2. The amount of deviation between the centroid PA of the operating region 61 of the third unit transistor 60 from the left end and the centroid PO of the cavity 45 positioned most adjacent to this unit transistor 60 is indicated by Dx3. The amounts of deviation Dx1 and Dx4 are greater than the amounts of deviation Dx2 and Dx3.

The centroid PO of the cavity 45 is displaced from the centroid PA of the operating region 61 in the y-axis direction as well as in the x-axis direction.

Advantages achieved by the configuration of the semiconductor apparatus according to the second embodiment will be discussed below.

In the second embodiment, the operating regions 61 of each unit transistor 60 are disposed within the pillar bump 40, as viewed from above in FIG. 2. In the sectional views of FIGS. 3 and 4, the pillar bump 40 is disposed immediately above the operating regions 61 of each unit transistor 60. With this configuration, the distance from the operating regions 61 to the pillar bump 40 becomes shorter than that in the configuration in which the pillar bump 40 is displaced from a position immediately above the operating regions 61.

The pillar bump 40 serves as a heat path for dissipating the heat generated in the operating regions 61 to the outside. The decreased distance from the operating regions 61 to the pillar bump 40 enhances the heat dissipation.

The operating regions 61 are disposed such that they entirely overlap with the pillar bump 40, as viewed from above. This configuration makes it possible to decrease the chip area of the semiconductor apparatus compared with the configuration in which the operating regions 61 extend to the outside of the pillar bump 40, thereby achieving a cost reduction.

The configuration of the semiconductor apparatus according to the second embodiment also makes it possible to reduce the thermal stress produced in the unit transistors 60. This advantage will be discussed below.

The thermal stress is produced due to the difference between the coefficient of thermal expansion of semiconductor layers, such as the emitter layer 34 (FIG. 3), and that of the pillar bump 40. The coefficient of thermal expansion of a metal forming the pillar bump 40 is greater than that of GaAs (about 6 ppm/° C.). For example, the coefficient of thermal expansion of Cu is about 17 ppm/° C. and that of Sn solder is about 22 ppm/° C. The coefficient of thermal expansion of a printed substrate (about 15 to 20 ppm/° C.) for mounting the semiconductor apparatus thereon is greater than that of GaAs.

Separating the centroid PO of the cavity 45 farther from the centroid PA of the operating region 61 makes the third-layer insulating film 52 intervene between the emitter layer 34 and the pillar bump 40. For example, as shown in FIG. 3, the third-layer insulating film 52 intervenes between the unit transistor 60 on the left side and the pillar bump 40. The third-layer insulating film 52 serves as a stress absorber to reduce the thermal stress produced in the semiconductor layers of the unit transistor 60. Crystal defects produced due to the thermal stress decrease the current amplification factor in a short period of time. In the second embodiment, the thermal stress is reduced, and the reliability is thus less likely to be decreased even under high-temperature operation. The magnitudes of the thermal stress produced in the plural unit transistors 60 vary because the positional relationship of the unit transistor 60 to the pillar bump 40 is different among the plural unit transistors 60. Regarding a unit transistor 60 located at a position where the thermal stress is less likely to produce, the emitter layer 34 of this unit transistor 60 may be disposed within the cavity 45, as viewed from above.

In most cases, the coefficient of thermal expansion of the material for the third-layer insulating film 52 is smaller than that of the material for the pillar bump 40 and that of a semiconductor material, such as GaAs. For example, the coefficient of thermal expansion of SiN for the third-layer insulating film 52 is about 2 to 3 ppm/° C. A material having a smaller coefficient of thermal expansion than that of a semiconductor material for the operating regions 61 of the unit transistor 60 is used for the third-layer insulating film 52, thereby exhibiting a noticeable effect of absorbing thermal stress.

In particular, the thermal stress produced in the semiconductor layers, such as the emitter layer 34, of the two unit transistors 60 positioned at both ends in the x-axis direction tends to be greater than that in the other unit transistors 60. In the second embodiment, the amounts of deviation Dx1 and Dx4 between the centroids PA of the operating regions 61 of the unit transistors 60 at both ends and the centroid PO of the corresponding cavities 45 are greater than the amounts of deviation Dx2 and Dx3 in the operating regions 61 of the other unit transistors 60. This can enhance the effect of reducing the thermal stress produced in the semiconductor layers of the unit transistors 60 at both ends. As a result, the magnitudes of thermal stress produced in the semiconductor layers of the plural unit transistors 60 can substantially be equalized, and the reliability of the overall semiconductor apparatus is less likely to be decreased.

With the configuration of the semiconductor apparatus according to the second embodiment, the heat dissipation from the operating regions 61 can be controlled for each unit transistor 60. This advantage will be discussed below.

The heat generated in the operating regions 61 (FIG. 3) is dissipated outside mainly via the emitter electrodes E0, the first-layer emitter wiring E1, the second-layer emitter wiring E2, and the pillar bump 40. Separating the centroid PO of the cavity 45 farther from the centroid PA of the operating region 61 makes the third-layer insulating film 52 intervene between the first-layer emitter wiring E1 and the pillar bump 40. For example, as shown in FIG. 3, the third-layer insulating film 52 is not interposed between the pillar bump 40 and the most part of the first-layer emitter wiring E1 connected to the unit transistor 60 on the right side. In contrast, as shown in FIG. 3, the third-layer insulating film 52 is interposed between the pillar bump 40 and the entirety of the first-layer emitter wiring E1 connected to the unit transistor 60 on the left side.

The thermal conductivity of SiN or resin used for the third-layer insulating film 52 is lower than that of a metal used for the wiring or the pillar bump 40. Accordingly, the thermal resistance of the area from the operating regions 61 of the left-side unit transistor 60 to the pillar bump 40 becomes higher than that of the area from the operating regions 61 of the right-side unit transistor 60 to the pillar bump 40. As a result, the heat dissipation from the operating regions 61 of the left-side unit transistor 60 becomes lower than that from the operating regions 61 of the right-side unit transistor 60. Usually, as the amount of deviation of the centroid PA of the operating region 61 of the unit transistor 60 from the centroid PO of the cavity 45 positioned most adjacent to this unit transistor 60 is greater, the heat dissipation from this operating region 61 becomes lower.

As shown in FIG. 2, the unit transistors 60 other than those located at both ends are sandwiched between other unit transistors 60 in the x-axis direction. The operating regions 61 of such inner-side unit transistors 60 are thus more likely to be at a higher temperature than those of the unit transistors 60 at both ends.

In the second embodiment, the amounts of deviation Dx2 and Dx3 are smaller than the amounts of deviation Dx1 and Dx4. Consequently, the heat dissipation from the operating regions 61 of the two inner-side unit transistors 60 is higher than that from the operating regions 61 of the two unit transistors 60 at both ends. The heat dissipation from the operating regions 61 where the temperature is likely to rise is relatively high. It is thus possible to reduce the variations in the temperatures of the operating regions 61 of the plural unit transistors 60. Conducting simulations or evaluation experiments by using different combinations of the amounts of deviation Dx1, Dx2, Dx3, and Dx4 can determine suitable amounts of deviation to substantially equalize the temperatures of the plural operating regions 61. This makes it possible to maintain the radio-frequency characteristics of the semiconductor apparatus.

In the semiconductor apparatus including the parallel-connected unit transistors 60 which operate together, the life of the unit transistors 60 where the temperature is likely to rise is relatively short. This also makes the life of the overall semiconductor apparatus short. Equalizing the temperatures of the operating regions 61 of the plural unit transistors 60 can prolong the life of the overall semiconductor apparatus.

In the second embodiment, no cavities 45 are formed outside the centroids PA of the operating regions 61 of the two unit transistors 60 located at both ends in the x-axis direction. Arranging the cavities 45 in this manner increases the heat dissipation from the operating regions 61 of the inner-side unit transistors 60 to be higher than that of the unit transistors 60 at both ends.

The advantages achieved by employing the configuration in which the centroid PO of the cavity 45 is displaced from the centroid PA of the operating region 61 of the unit transistor 60 in the x-axis direction have been validated by conducting the simulations. The simulations will be discussed below with reference to FIGS. 5A through 6B. The subject of the simulations is unit transistors 60 each including one operating region 61.

Figure 5A:
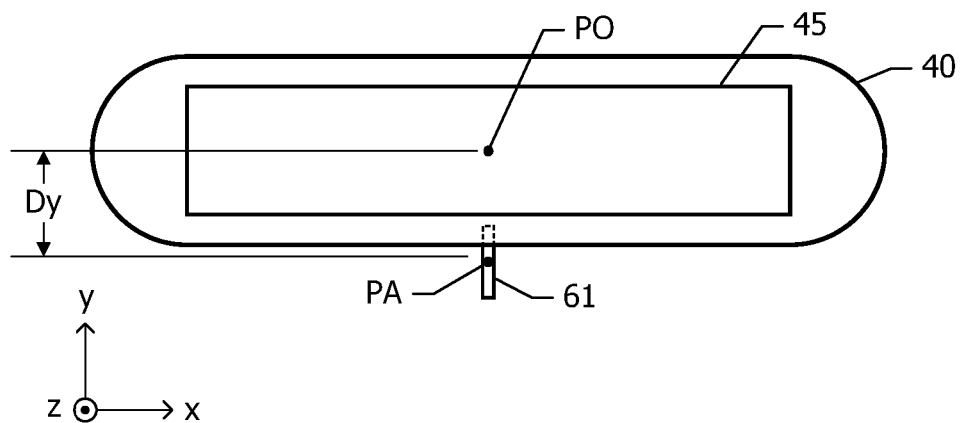
FIG. 5A is a plan view illustrating the positional relationships among an operating region of a unit transistor, a cavity, and a pillar bump of a semiconductor apparatus according to a comparative example.

FIG. 5A is a plan view illustrating the positional relationships among an operating region 61 of a unit transistor 60, a cavity 45, and a pillar bump 40 of a semiconductor apparatus according to a comparative example. The planar configuration of the pillar bump 40 is a race-track shape formed in the following manner. Semicircles having a diameter of about 75 μm are connected to the longitudinal ends of a rectangle having a length of about 240 μm in the x-axis direction and a width of about 75 μm in the y-axis direction. The dimensions of the operating region 61 are about 4 μm in the x-axis direction and about 30 μm in the y-axis direction. The dimensions of the cavity 45 are about 240 μm in the x-axis direction and about 51 μm in the y-axis direction. The position of the centroid PA of the operating region 61 and the centroid PO of the cavity 45 coincide with each other in the x-axis direction and are displaced from each other in the y-axis direction. The absolute value of the amount of deviation between the centroid PA and the centroid PO in the y-axis direction is indicated by Dy.

Figure 5B:
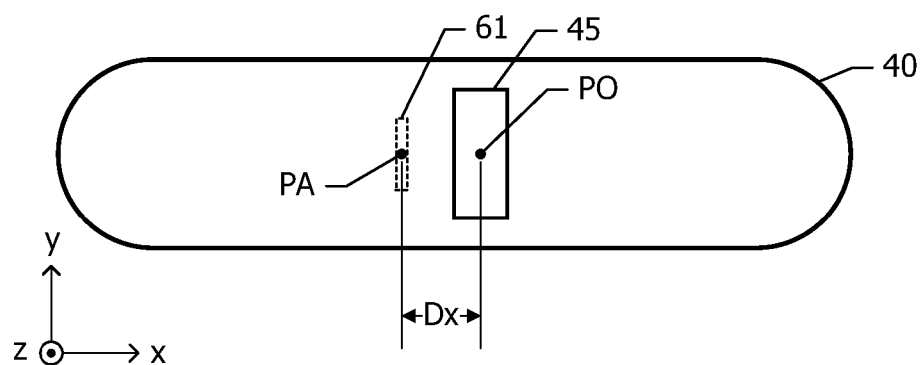
FIG. 5B is a plan view illustrating the positional relationships among an operating region of a unit transistor, a cavity, and a pillar bump of a semiconductor apparatus according to an embodiment.

FIG. 5B is a plan view illustrating the positional relationships among an operating region 61 of a unit transistor 60, a cavity 45, and a pillar bump 40 of a semiconductor apparatus according to an embodiment. The configuration and the dimensions of the pillar bump 40 and those of the operating region 61 are the same as those of the semiconductor apparatus shown in FIG. 5A. The dimensions of the cavity 45 are about 20 μm in the x-axis direction and about 50 μm in the y-axis direction. The position of the centroid PA of the operating region 61 and the centroid PO of the cavity 45 coincide with each other in the y-axis direction and are displaced from each other in the x-axis direction. The absolute value of the amount of deviation between the centroid PA and the centroid PO in the x-axis direction is indicated by Dx.

In the simulations, thermal stress produced in the emitter regions 34A (FIGS. 3 and 4) when the temperature of each semiconductor apparatus was about 150° C. was found. Thermal resistance in the area from the emitter regions 34A to the pillar bump 40 was also found.

Figure 6A:
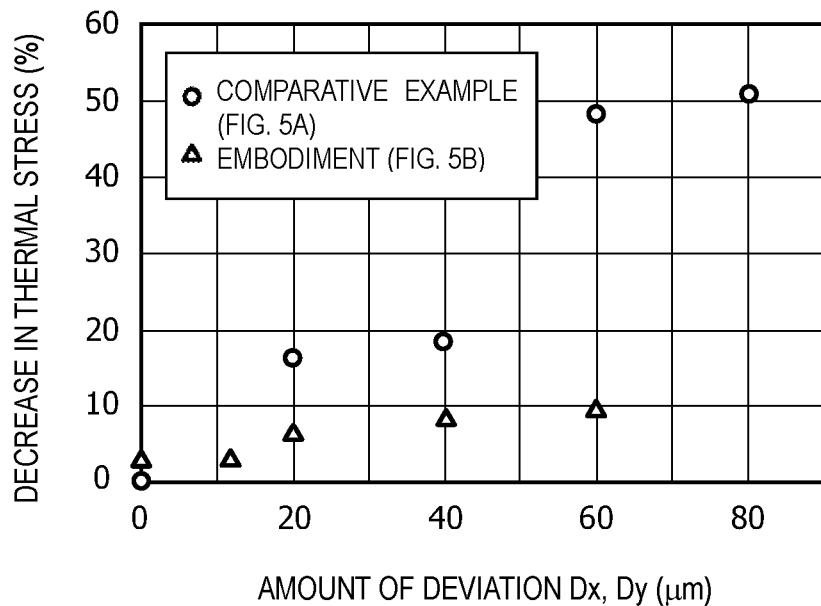
FIG. 6A is a graph illustrating the relationship between the amounts of deviation Dx and Dy and a decrease in the thermal stress produced in the emitter regions.

FIG. 6A is a graph illustrating the relationship between the amounts of deviation Dx and Dy and a decrease in thermal stress produced in the emitter regions 34A. The horizontal axis of the graph indicates the amounts of deviation Dx and Dy by "μm", and the vertical axis indicates a decrease in thermal stress by "%". The circles in the graph represent the calculation results of a decrease in thermal stress in the comparative example (FIG. 5A), while the triangles represent the calculation results of a decrease in thermal stress in the embodiment (FIG. 5B). The value of thermal stress produced in the semiconductor apparatus of the comparative example (FIG. 5A) when the amount of deviation Dy is 0 is set as a reference value. A decrease in thermal stress is represented by the ratio of the amount of decrease from the reference value to the reference value.

FIG. 6A shows that, in the semiconductor apparatus of the comparative example (FIG. 5A), as the amount of deviation Dy increases, the thermal stress is reduced to a smaller level. FIG. 6A also shows that, in the semiconductor apparatus of the embodiment (FIG. 5B), as the amount of deviation Dx increases, the thermal stress is reduced to a smaller level, though the degree of a decrease is smaller than that in the comparative example.

Figure 6B:
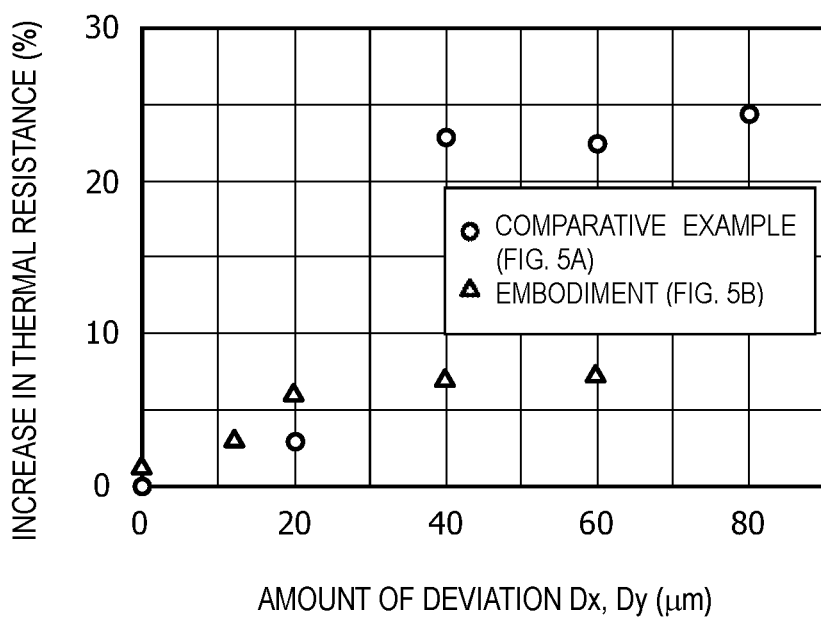
FIG. 6B is a graph illustrating the relationship between the amounts of deviation Dx and Dy and an increase in the thermal resistance.

FIG. 6B is a graph illustrating the relationship between the amounts of deviation Dx and Dy and an increase in thermal resistance. The horizontal axis of the graph indicates the amounts of deviation Dx and Dy by "μm", and the vertical axis indicates an increase in thermal resistance by "%". The circles in the graph represent the calculation results of an increase in thermal resistance in the comparative example (FIG. 5A), while the triangles indicate the calculation results of an increase in thermal resistance in the embodiment (FIG. 5B). The value of the thermal resistance observed in the semiconductor apparatus of the comparative example (FIG. 5A) when the amount of deviation Dy is 0 is set as a reference value. An increase in thermal resistance is represented by the ratio of the amount of increase from the reference value to the reference value. FIG. 6B shows that, as the amounts of deviation Dx and Dy increase, the thermal resistance rises to a higher level. The simulation results show that the thermal resistance can be controlled by changing the amount of deviation of the centroid PO of the cavity 45 from the centroid PA of the operating region 61 in the x-axis direction or in the y-axis direction.

Modified examples of the second embodiment will be discussed below. In the second embodiment, the emitter electrodes E0 are disposed between the emitter mesa layers 35 (FIG. 3) and the first-layer emitter wiring E1 (FIG. 3). The first-layer emitter wiring E1 may alternatively directly contact with the emitter mesa layers 35. In this case, the provision of the emitter electrodes E0 is omitted, and the first-layer emitter wiring E1 also serves as the function of an emitter electrode.

In the second embodiment, as shown in FIG. 2, the centroid PO of each cavity 45 is displaced from the centroid PA of the operating region 61 of the corresponding unit transistor 60 in the x-axis direction. However, it is sufficient if the centroid PO of at least one cavity 45 is displaced from the centroid PA of the operating region 61 of the corresponding unit transistor 60. "Being displaced in the x-axis direction" means that the centroid PO is displaced from the centroid PA such that a vector starting from the centroid PA until the centroid PO contains x components.

In the second embodiment, two cavities 45 are provided to connect the pillar bump 40 and the second-layer emitter wiring E2. However, the provision of at least one cavity 45 is sufficient.

Although the pillar bump 40 is used as an external connection bump in the second embodiment, another type of bump, such as a solder bump or a stud bump, may alternatively be used. Although the planar configuration of the emitter layer 34 and that of the emitter mesa layers 35 (FIGS. 2 through 4) are substantially a rectangle in the second embodiment, they may be formed in another shape, such as a circle, an ellipse, a hexagon, or an octagon.

Although InGaP is used for the emitter layer 34 and GaAs is used for the base layer 33 in the second embodiment, other types of compound semiconductors may be used. Examples of the combination of the material for the emitter layer 34 and that for the base layer 33 are AlGaAs/GaAs, InP/InGaAs, InGaP/GaAsSb, InGaP/InGaAsN, Si/SiGe, and AlGaN/GaN. In any of the combinations, the emitter-base interface is a heterojunction.

Although the semiconductor apparatus of the second embodiment includes four unit transistors 60, as shown in FIG. 2, it may include any other plural number of unit transistors 60.

Third Embodiment

A semiconductor apparatus according to a third embodiment will be described below with reference to FIG. 7. An explanation of the elements configured in the same manner as those of the second embodiment will be omitted.

FIG. 7 is a plan view illustrating the layout of the elements forming the semiconductor apparatus according to the third embodiment. In the third embodiment, three unit transistors 60 are arranged in the x-axis direction. However, four unit transistors 60 may be provided, as in the first embodiment, or two or five or more unit transistors 60 may be provided. In the second embodiment, one unit transistor 60 includes two emitter regions 34A (FIGS. 2 and 3). In the third embodiment, one unit transistor 60 includes one emitter region 34A, that is, one unit transistor 60 includes one operating region 61. The operating region 61 is defined by the outer edge lines of the emitter region 34A for each unit transistor 60. In FIG. 7, the operating regions 61 are indicated by the hatched portions with high-density right-downward lines.

As in the second embodiment, the planar configuration of the emitter region 34A is substantially a rectangle elongated in the y-axis direction. The main portion of the base electrode B0 is disposed next to the emitter region 34A in the x-axis direction. Although the planar configuration of the base electrode B0 is a T-like shape in the second embodiment, it is an L-like shape in the third embodiment.

In the second embodiment, the centroid PA of the operating region 61 of the unit transistor 60 is positioned at the center of the two operating regions 61. In the third embodiment, one unit transistor 60 includes one operating region 61, and the centroid PA of the operating region 61 is located at the center of gravity of the operating region 61. That is, the centroid PA of the operating region 61 is located at the point of intersection of the two diagonal lines of the rectangular operating region 61. One cavity 45 is formed within the pillar bump 40, as viewed from above. In FIG. 7, the cavity 45 is indicated by the hatched portion with low-density right-upward lines. In the third embodiment, as well as in the second embodiment, the centroid PO of the cavity 45 is displaced from the centroid PA of the operating region 61 in the x-axis direction.

The positional relationship between the operating region 61 and the cavity 45 in the third embodiment is similar to that in the second embodiment. Advantages similar to those of the second embodiment are thus achieved in the third embodiment.

Fourth Embodiment

A semiconductor apparatus according to a fourth embodiment will be described below with reference to FIGS. 8 through 12. An explanation of the elements configured in the same manner as those of the second embodiment will be omitted. The semiconductor apparatus of the fourth embodiment is a power amplifier module using the plural unit transistors 60 (FIG. 2) of the second embodiment as amplifiers.

Figure 8:
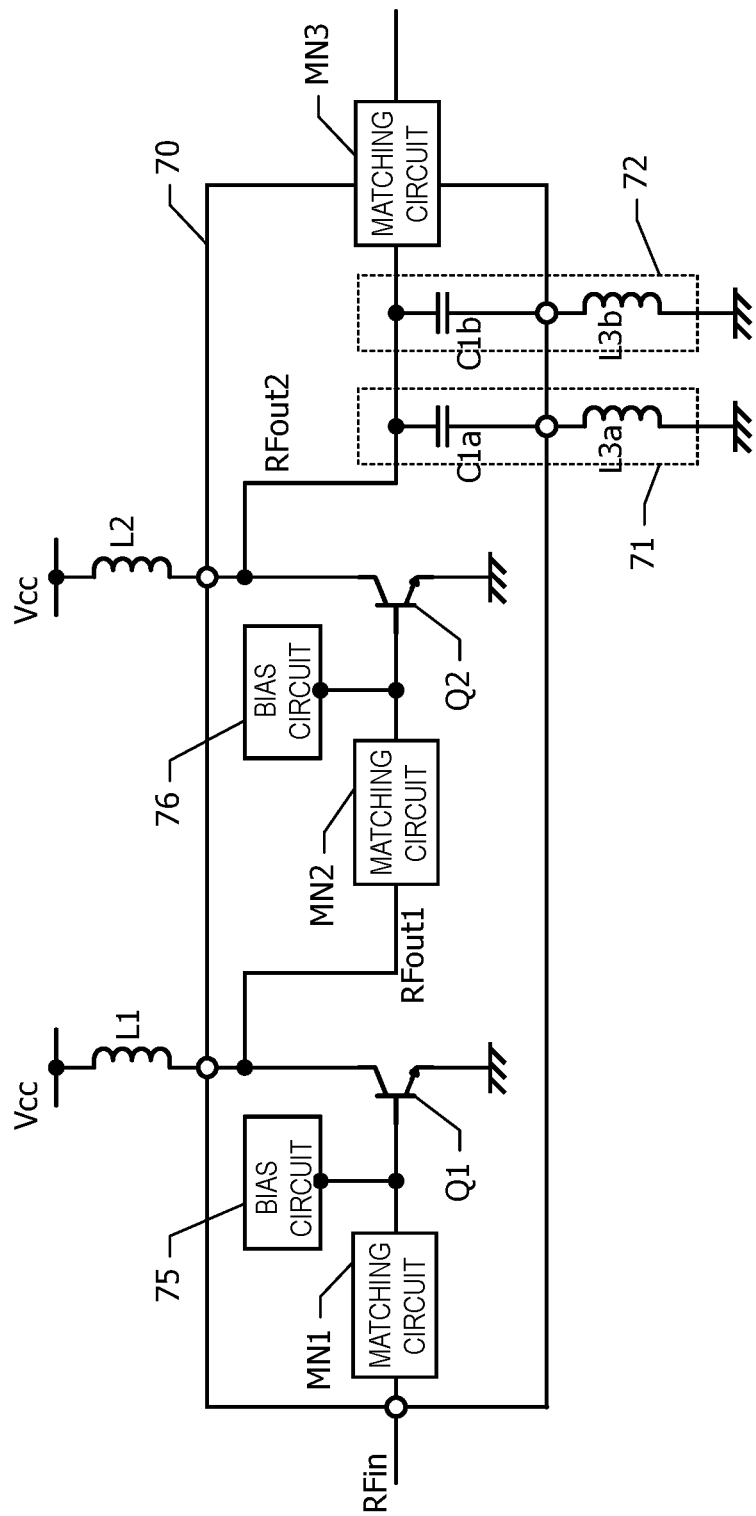
FIG. 8 is an equivalent circuit diagram of a power amplifier circuit implemented by a semiconductor apparatus according to a fourth embodiment.

FIG. 8 is an equivalent circuit diagram of a power amplifier circuit implemented by the semiconductor apparatus according to the fourth embodiment. The power amplifier circuit in the fourth embodiment amplifies an input signal in a radio-frequency band and outputs an amplified signal. The frequency of the input signal is in a range of several hundreds of megahertz (about 600 MHz, for example) to several dozens of gigahertz (60 GHz, for example).

The power amplifier circuit using the semiconductor apparatus according to the fourth embodiment includes transistors Q1 and Q2, matching circuits MN1, MN2, and MN3, filter circuits 71 and 72, bias circuits 75 and 76, and inductors L1 and L2. The transistor Q1 forms a first-stage (drive-stage) power amplifier circuit, while the transistor Q2 forms a second-stage (power-stage) power amplifier circuit. The transistors Q1 and Q2 are each formed such that the plural unit transistors 60 are connected in parallel with each other, as in the semiconductor apparatus of the second or third embodiment.

A power supply voltage Vcc is supplied to the collector of the transistor Q1 via the inductor L1, while a power supply voltage Vcc is supplied to the collector of the transistor Q2 via the inductor L2. The emitters of the transistors Q1 and Q2 are grounded. A bias current or a bias voltage is supplied to the base of the transistor Q1 from the bias circuit 75, while a bias current or a bias voltage is supplied to the base of the transistor Q2 from the bias circuit 76.

An input signal RFin is supplied to the base of the transistor Q1 via the matching circuit MN1. The transistor Q1 amplifies the input signal RFin and outputs an amplified signal RFout1 from the collector. The amplified signal RFout1 is supplied to the base of the transistor Q2 via the matching circuit MN2. The transistor Q2 amplifies the amplified signal RFout1 and outputs an amplified signal RFout2 from the collector. The amplified signal RFout2 is supplied to an external circuit via the matching circuit MN3.

The filter circuits 71 and 72 are each connected between a ground and a transmission line which connects the collector of the transistor Q2 and the matching circuit MN3. The filter circuit 71 is a series resonance circuit including a capacitor C1a and an inductor L3a connected in series with each other. The filter circuit 72 is a series resonance circuit including a capacitor C1b and an inductor L3b connected in series with each other. The filter circuits 71 and 72 each serve as a harmonic terminating circuit that attenuates the frequency components in a harmonic band contained in the amplified signal RFout2. The harmonic terminating circuit adjusts the impedance so that the impedance of a subject harmonic (impedance of a second order harmonic or a third order harmonic) will become short or open unlike the impedance of fundamental waves. Setting or adjusting of the impedance of a certain order of harmonic separately from the impedance of the fundamental waves can attenuate the harmonic components. The circuit constants of the capacitors C1a and C1b and the inductors L3a and L3b of the filter circuits 71 and 72 are selected so that the resonant frequency substantially matches the frequency of a harmonic, such as the frequency of the second order harmonic or the third order harmonic, of the amplified signal RFout2.

The transistors Q1 and Q2, the matching circuits MN1 and MN2, the bias circuits 75 and 76, the capacitors C1a and C1b of the filter circuits 71 and 72, and a part of the matching circuit MN3 are formed within a single semiconductor chip 70. The inductors L1 and L2, the inductors L3a and L3b of the filter circuits 71 and 72, and the remaining part of the matching circuit MN3 are formed or mounted on a mounting substrate for mounting the semiconductor chip 70 thereon. The inductors L3a and L3b of the filter circuits 71 and 72 are implemented by wiring containing the inductance components formed in or on the mounting substrate.

Figure 9:
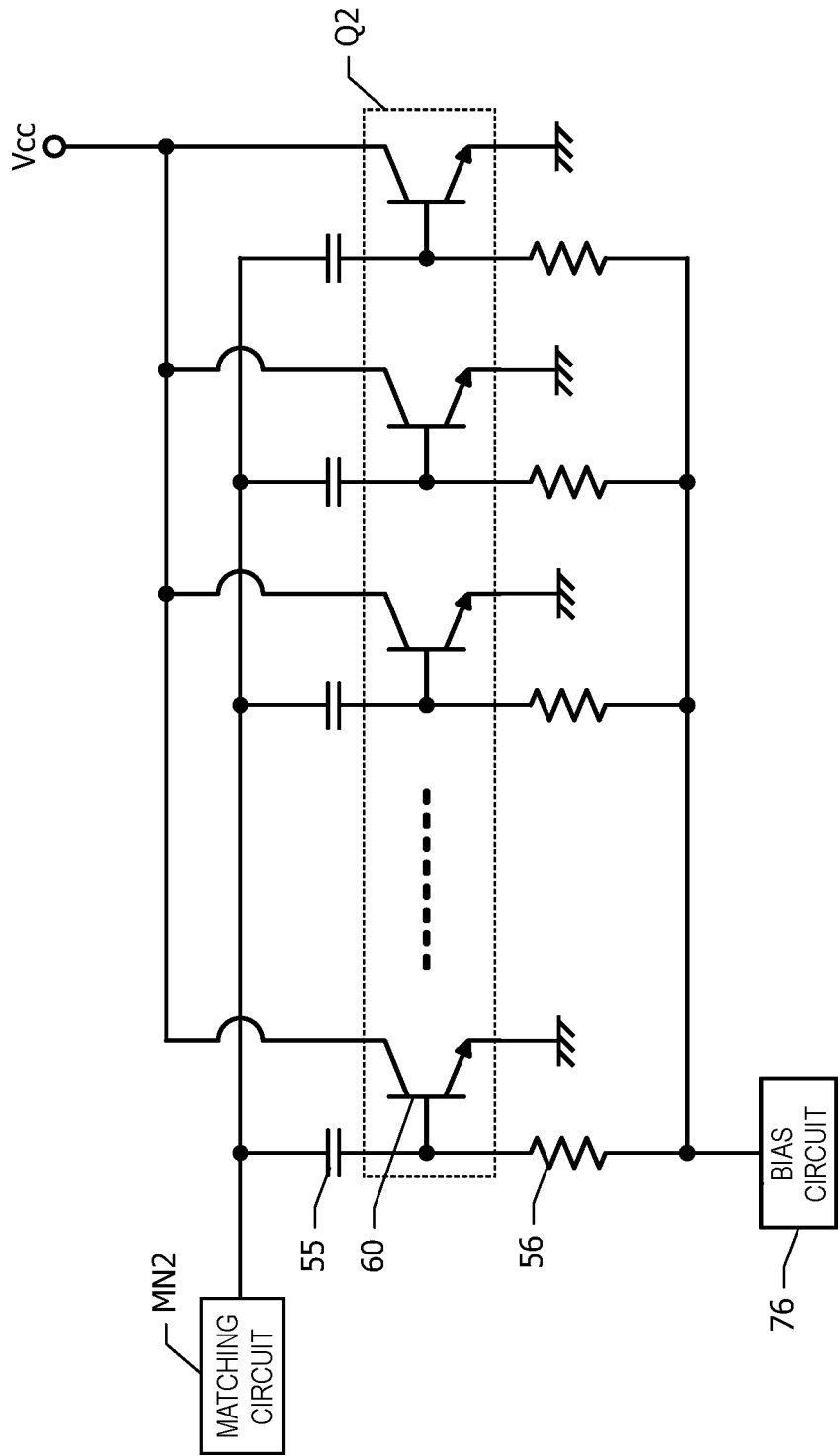
FIG. 9 is an equivalent circuit diagram of a transistor Q2 and its peripheral circuit.

FIG. 9 is an equivalent circuit diagram of the transistor Q2 and its peripheral circuit. The transistor Q2 is constituted by plural unit transistors 60 connected in parallel with each other, as in the semiconductor apparatus of the second or third embodiment. A capacitor 55 and a ballast resistor 56 are connected to the base of each of the plural unit transistors 60. The capacitor 55 and the ballast resistor 56 correspond to the counterparts shown in FIG. 2.

A radio-frequency signal passing through the matching circuit MN2 is supplied to the bases of the unit transistors 60 via the corresponding capacitors 55. A bias current or a bias voltage is supplied to the bases of the unit transistors 60 from the bias circuit 76 via the corresponding ballast resistors 56. The collectors of the unit transistors 60 are connected to the power supply voltage Vcc in a direct current (DC) range. The emitters of the unit transistors 60 are grounded.

FIG. 10 is a plan view illustrating the layout of the devices on the semiconductor chip 70 forming the semiconductor apparatus according to the fourth embodiment. The planar configuration of the semiconductor chip 70 is substantially a rectangle having two sides parallel with each other in the x-axis direction and two sides parallel with each other in the y-axis direction. Pillar bumps 81, 82, and 83 elongated in the x-axis direction are provided on the semiconductor chip 70.

The pillar bump 81 is connected to the emitters of four unit transistors 60 forming the transistor Q1 (FIG. 8). The transistor Q2 is constituted by two sets of unit transistors 60, each set including ten unit transistors 60. The unit transistors 60 of each set are connected in parallel with each other. The emitters of the ten unit transistors 60 of one set are connected to the pillar bump 82, and the emitters of the ten unit transistors 60 of the other set are connected to the pillar bump 83.

The pillar bumps 82 and 83 have the same planar configuration and the same dimensions and are disposed with a space therebetween in the y-axis direction. The pillar bump 81 is shorter than the pillar bumps 82 and 83. This is because fewer unit transistors 60 are connected to the pillar bump 81 than those connected to each of the pillar bumps 82 and 83.

The capacitors C1a and C1b forming the filter circuits 71 and 72 (FIG. 8) are disposed on the semiconductor chip 70. On-chip capacitors formed on the semiconductor chip 70 are used as the capacitors C1a and C1b. It is now assumed that the right end of the arrangement direction of the unit transistors 60 connected to the pillar bump 82 or 83 is a first end, while the left end is a second end. The capacitor C1a is disposed at a position closer to the unit transistor 60 at the second end. The capacitor C1b is disposed at a position closer to the unit transistor 60 at the first end.

That is, the capacitors C1a and C1b are disposed closely to the unit transistors 60 positioned at the opposite ends of the arrangement direction (x-axis direction) of the plural unit transistors 60. For example, the capacitors C1a and C1b are located symmetrically with each other with respect to the center line of the semiconductor chip 70 in the x-axis direction.

The capacitor C1a is connected to a circular pillar bump 84 via wiring formed on the semiconductor chip 70. When the semiconductor chip 70 is mounted on a mounting substrate, the capacitor C1a is electrically connected to the inductor L3a on the mounting substrate via the pillar bump 84. Likewise, the capacitor C1b is electrically connected to the inductor L3b on the mounting substrate via a circular pillar bump 85.

Plural circular pillar bumps 86 are also provided on the semiconductor chip 70. Some pillar bumps 86 are connected to the collectors of the transistors Q1 and Q2 (FIG. 8), and some pillar bumps 86 are connected to the matching circuits MN1 and MN3 (FIG. 8).

Figure 11A:
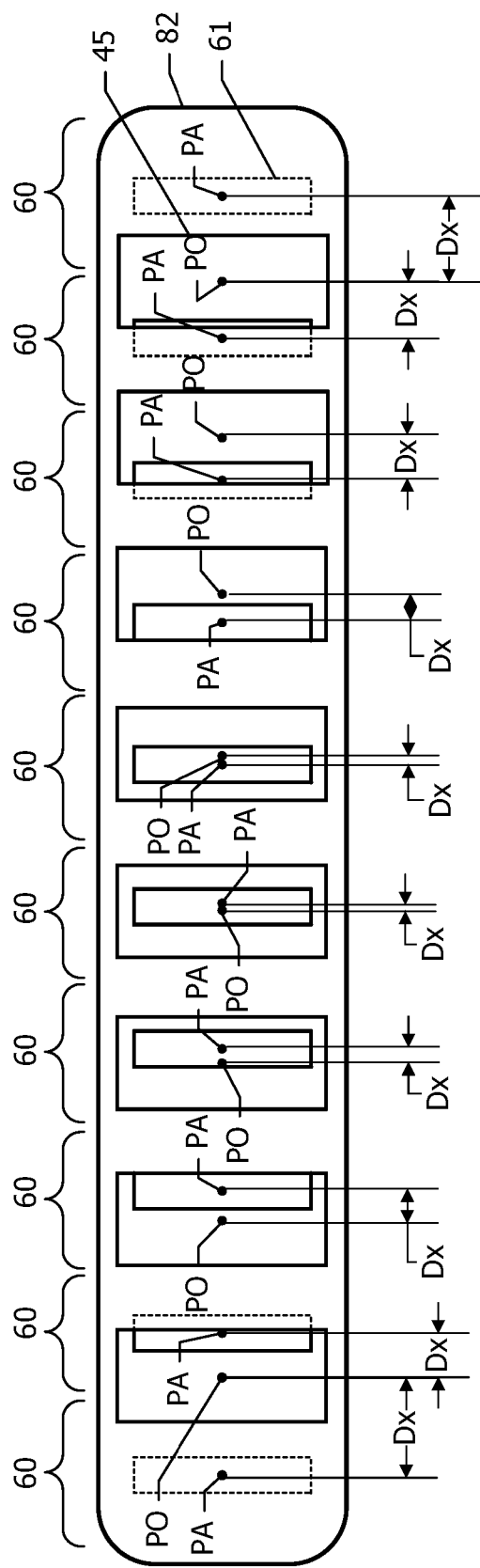
FIG. 11A illustrates the positional relationships among a pillar bump, operating regions of plural unit transistors connected to the pillar bump, and plural cavities.

FIG. 11A illustrates the positional relationships among the pillar bump 82, the operating regions 61 of the plural (ten) unit transistors 60 connected to the pillar bump 82, and the plural cavities 45. The ten operating regions 61 and the eight cavities 45 are arranged in the x-axis direction. Although each unit transistor 60 includes one operating region 61 in FIG. 11A, as in the configuration in FIG. 7, it may include two operating regions 61, as in the configuration in FIG. 2.

The amount of deviation in the x-axis direction between the centroid PA of each operating region 61 and the centroid PO of the cavity 45 most adjacent to the corresponding operating region 61 (hereinafter called the amount of deviation of the closest proximity cavity 45) is indicated by Dx. The amount of deviation Dx of the closest proximity cavity 45 is set for each unit transistor 60. The centroid PO of each cavity 45 is displaced from the centroid PA of the corresponding operating region 61. That is, the amount of deviation Dx of the closest proximity cavity 45 is not 0. All the cavities 45 are positioned farther inward than the centroids PA of the operating regions 61 of the unit transistors 60 located at both ends, and no cavities 45 are formed outside the centroids PA of the operating regions 61 of these unit transistors 60.

The amounts of deviation Dx of the closest proximity cavities 45 with respect to the unit transistors 60 at both ends are greater than those with respect to the eight inner-side unit transistors 60. The amount of deviation Dx of the closest proximity cavity 45 becomes greater from the center to the ends of the arrangement direction of the plural unit transistors 60.

Regarding the pillar bumps 81 and 83 (FIG. 10), the positional relationships among the pillar bumps 81 and 83, the operating regions 61 of the plural unit transistors 60 connected to the pillar bumps 81 and 83, and the plural cavities 45 are similar to those of the pillar bump 82. The shape and the dimensions of the cavities 45 disposed within the pillar bumps 81, 82, and 83 are the same.

Figure 11B:
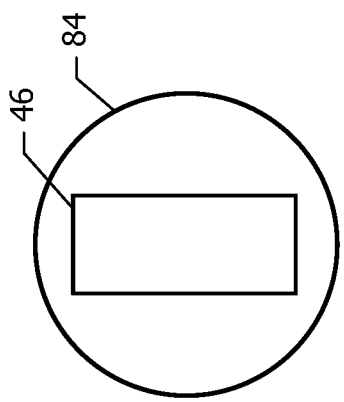
FIG. 11B illustrates the positional relationship between a circular pillar bump and a cavity disposed under the pillar bump.

FIG. 11B is a plan view illustrating the positional relationship between the circular pillar bump 84 and a cavity 46 disposed under the pillar bump 84. The pillar bump 84 is electrically connected to wiring under the pillar bump 84 via the cavity 46. One cavity 46 is formed for the single pillar bump 84. Cavities are similarly formed for the circular pillar bumps 85 and 86 (FIG. 10).

The shape and the dimensions of the cavity 46 provided for the circular pillar bump 84 and those for the circular pillar bumps 85 and 86 are the same as those of the cavities 45 provided for the pillar bumps 81, 82, and 83 (FIG. 10) elongated in the x-axis direction.

FIG. 12 is a sectional view of the semiconductor apparatus according to the fourth embodiment. The semiconductor chip 70 is soldered to a mounting substrate 90 via the pillar bumps 81, 82, 83, and 86. An alumina, ceramic, or epoxy printed substrate is used as the mounting substrate 90. On the mounting substrate 90, the inductors L3a and L3b (FIG. 10) and a surface mounting device 91, as well as the semiconductor chip 70, are mounted. The semiconductor chip 70, the inductors L3a and L3b, and the surface mounting device 91 are sealed with a sealing resin 93.

Advantages achieved by the configuration of the semiconductor apparatus according to the fourth embodiment will be discussed below.

In the fourth embodiment, as shown in FIG. 11A, the positional relationships among the pillar bump 82, the operating regions 61 of the unit transistors 60 connected to the pillar bump 82, and the plural cavities 45 are similar to those in the second or third embodiment. Advantages similar to those of the second or third embodiment are thus achieved.

In the fourth embodiment, the capacitors C1a and C1b of the filter circuits 71 and 72 are disposed adjacent to the unit transistors 60 at opposite ends of the arrangement direction (x-axis direction) of the plural unit transistors 60. This improves the characteristics of the filter circuits 71 and 72 as the harmonic terminating circuits, thereby enhancing the performance of the power amplifiers.

In the fourth embodiment, the shape and the dimensions of the plural cavities 45 (FIG. 11A) for the pillar bumps 81, 82, and 83 and those of the cavity 46 (FIG. 11B) for the circular pillar bump 84 and those for the circular pillar bumps 85 and 86 are the same. Because of this arrangement, when the pillar bumps 81 through 86 are formed by plating, the portions of the pillar bumps embedded in the cavities can be made uniform. It is thus possible to improve the manufacturing yield.

To make the embedded portions of each of the pillar bumps 81, 82, and 83 uniform, it is preferable that the corresponding plural cavities 45 (FIG. 11A) be arranged at equal intervals. It is also preferable that the interval between the plural cavities 45 provided for the pillar bump 81, that for the pillar bump 82, and that for the pillar bump 83 be the same.

In the fourth embodiment, the power amplifier circuit is formed in two stages of power amplifiers. As a modified example of the fourth embodiment, the power amplifier circuit may be formed in one stage of power amplifier or three or more stages of power amplifiers.

Fifth Embodiment

A semiconductor apparatus according to a fifth embodiment will be described below with reference to FIGS. 13 through 15. An explanation of the elements configured in the same manner as those of the fourth embodiment in FIGS. 8 through 12 will be omitted.

Figure 13:
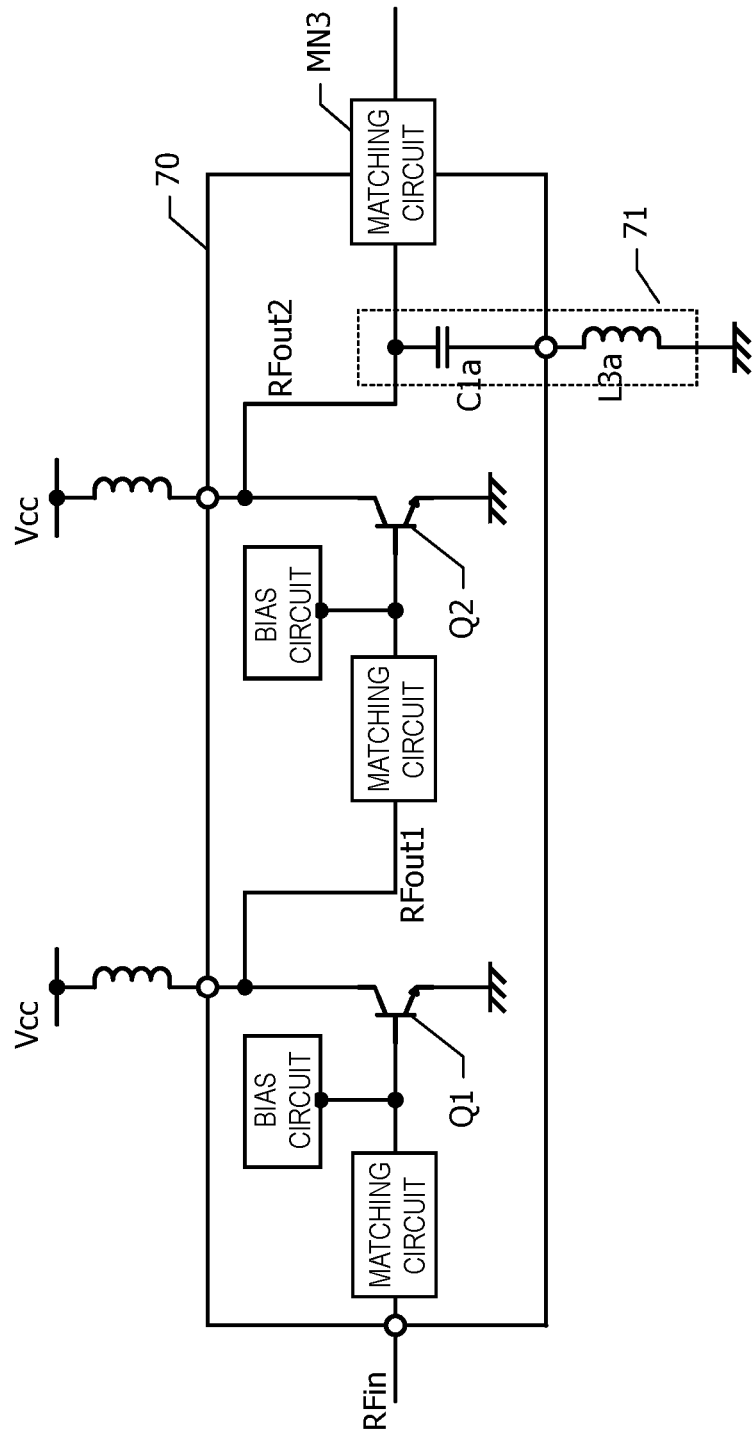
FIG. 13 is an equivalent circuit diagram of a power amplifier circuit implemented by a semiconductor apparatus according to a fifth embodiment.

FIG. 13 is an equivalent circuit diagram of a power amplifier circuit implemented by the semiconductor apparatus according to the fifth embodiment. In the fourth embodiment, the two filter circuits 71 and 72 are connected in parallel with each other between a ground and the transmission line which connects the collector of the transistor Q2 and the matching circuit MN3. In the fifth embodiment, only one filter circuit 71 is connected. As in the fourth embodiment, the filter circuit 71 is a series resonance circuit including a capacitor C1a and an inductor L3a connected in series with each other.

The configuration of the transistor Q1 is the same as that of the semiconductor apparatus of the fourth embodiment (FIG. 8). The transistor Q2 is constituted by two sets of unit transistors 60, as in the transistor Q2 of the semiconductor apparatus of the fourth embodiment. In the fourth embodiment, each set includes ten unit transistors 60 (FIG. 11A). In the fifth embodiment, each set includes eight unit transistors 60.

Figure 14:
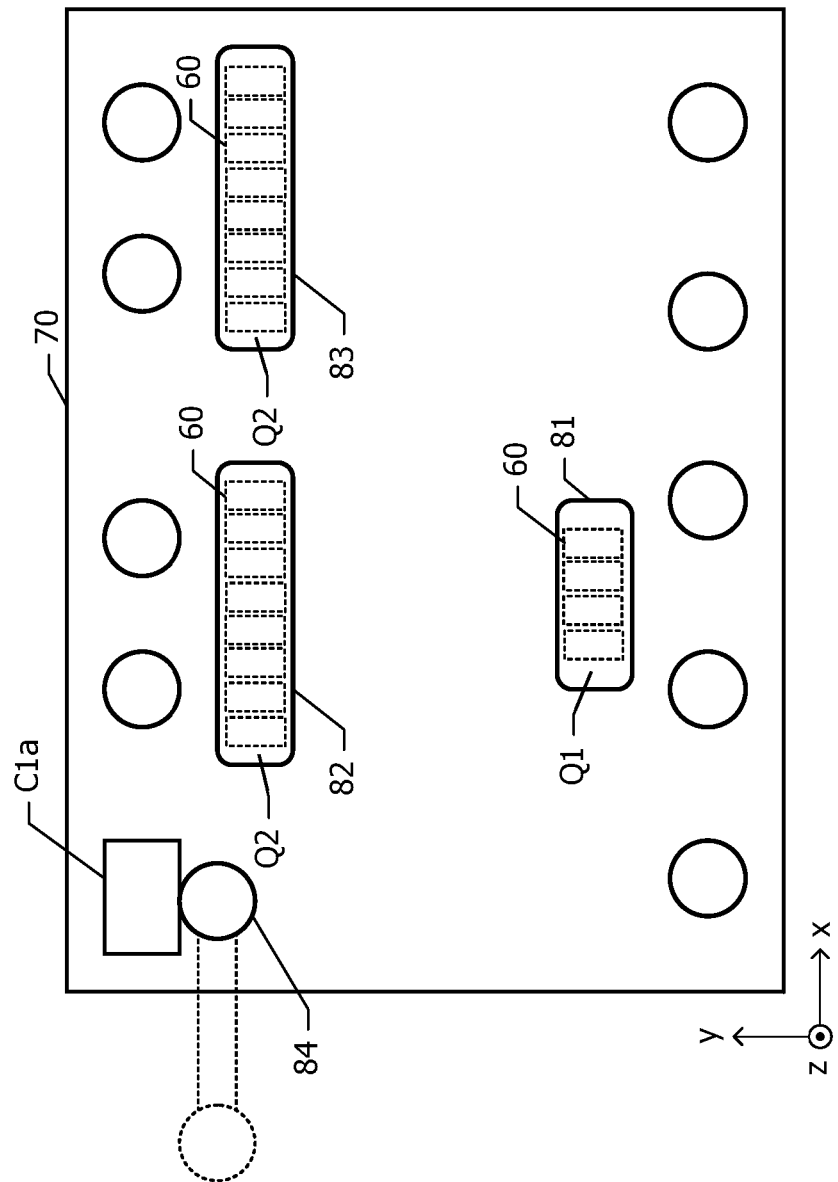
FIG. 14 is a plan view illustrating the layout of the devices on a semiconductor chip forming the semiconductor apparatus according to the fifth embodiment.

FIG. 14 is a plan view illustrating the layout of the devices on the semiconductor chip 70 forming the semiconductor apparatus according to the fifth embodiment. Eight unit transistors 60 are connected to each of the pillar bumps 82 and 83. Fewer unit transistors 60 are connected to each of the pillar bumps 82 and 83 than those in the fourth embodiment. The pillar bumps 82 and 83 in the semiconductor apparatus of the fifth embodiment are thus shorter than those in the fourth embodiment. The pillar bump 83 is disposed on a line extending from the pillar bump 82 in the x-axis direction.

In the fifth embodiment, the capacitor C1b (FIG. 10) used in the fourth embodiment is omitted, and only the capacitor C1a is used. The circular pillar bump 85 (FIG. 10) is not accordingly provided. The capacitor C1a is disposed closely to the unit transistor 60 positioned at one end of the pillar bump 82.

Figure 15:
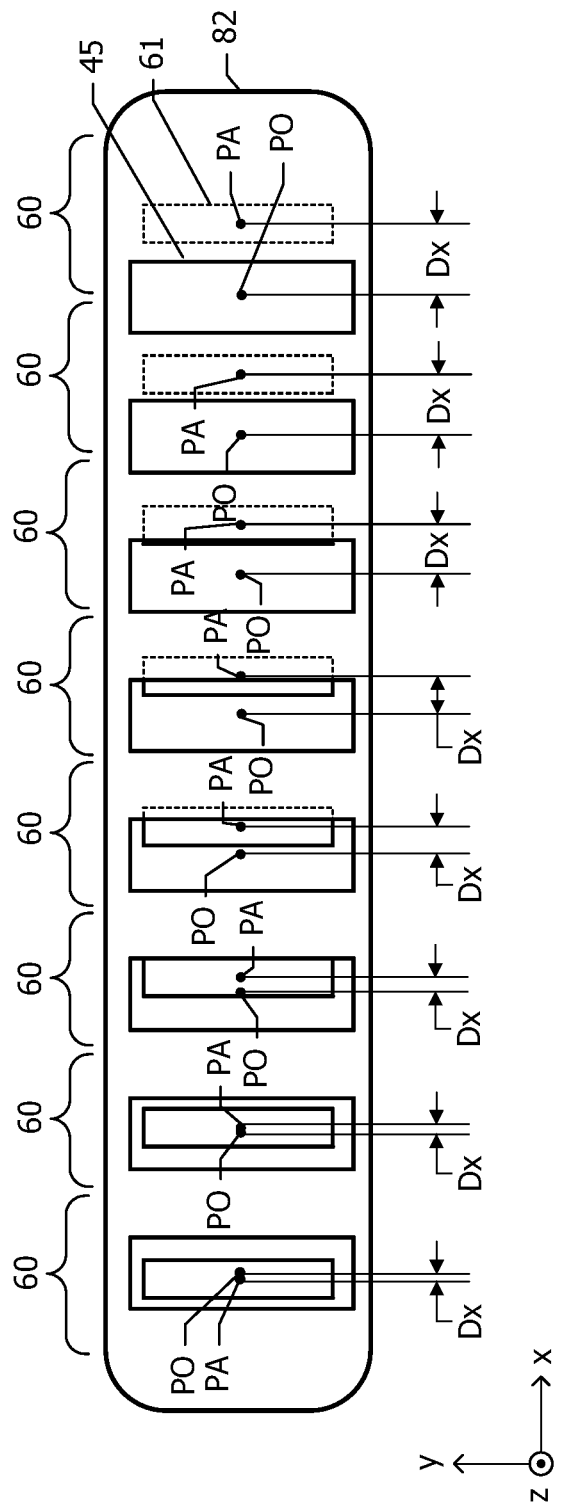
FIG. 15 illustrates the positional relationships among a pillar bump, operating regions of unit transistors, and cavities.

FIG. 15 illustrates the positional relationships among the pillar bump 82, the operating regions 61 of the unit transistors 60, and the cavities 45. The operating regions 61 of the eight unit transistors 60 are arranged in the x-axis direction within the pillar bump 82 having a planar configuration elongated in the x-axis direction. The eight cavities 45 are also arranged in the x-axis direction within the pillar bump 82.

The amount of deviation Dx of the closest proximity cavity 45 with respect to the unit transistor 60 at the first end (right end) is greater than that with respect to the unit transistor 60 at the second end (the left end). The amount of deviation Dx of the closest proximity cavity 45 becomes greater from the second end (the left end) to the first end (the right end). The capacitor C1a (FIG. 14) of the filter circuit 71 is disposed near the left end of the pillar bump 82.

Advantages achieved by the configuration of the semiconductor apparatus according to the fifth embodiment will be discussed below.

The present inventors have found that, when the filter circuit 71 (FIG. 14) which serves as a harmonic terminating circuit is connected to the collector of the transistor Q2 (FIG. 13), heating in the plural unit transistors 60 does not uniformly occur under the high-frequency operation of the unit transistors 60. For example, the present inventors have found that the amount of the generated heat tends to be gradually decreased from the unit transistor 60 at the left end to the unit transistor 60 at the right end in the example in FIG. 15.

In the fifth embodiment, the heat dissipation from the operating regions 61 of the unit transistors 60 is adjusted so that variations in the amount of the heat generated in the individual unit transistors 60 will cancel each other out. More specifically, the amount of deviation Dx of the closest proximity cavity 45 is adjusted to become greater from the unit transistor 60 at the left end to that at the right end, so that heat dissipation of the operating region 61 is gradually decreased from the unit transistor 60 at the left end to that at the right end. With this configuration, the temperatures of the operating plural unit transistors 60 can be substantially equalized.

Additionally, the average of the amounts of the heat generated in the plural unit transistors 60 connected to the pillar bump 82 (FIG. 14) and that in the plural unit transistors 60 connected to the pillar bump 83 (FIG. 14) may not become uniform. In the example in FIG. 14, the average of the amounts of the heat generated in the unit transistors 60 connected to the pillar bump 82 closer to the capacitor C1a of the filter circuit 71 is greater than that in the plural unit transistors 60 connected to the pillar bump 83. In this case, the average of the amounts of deviation Dx of the closest proximity cavities 45 with respect to the unit transistors 60 that generate a greater amount of heat on average is set to be smaller than that with respect to the unit transistors 60 that generate a smaller amount of heat on average. This can decrease the difference in the temperature between the operating plural unit transistors 60 connected to the pillar bump 82 and those connected to the pillar bump 83.

Depending on the high-frequency operating conditions for the semiconductor apparatus, the distribution in the amount of the generated heat may become different from the above-described distribution. In this case, the distribution in the amount of deviation Dx of the closest proximity cavity 45 is determined so as to cancel out the variations in the amount of heat.

Even when the two filter circuits 71 and 72 serving as harmonic terminating circuits are connected, such as in the semiconductor apparatus of the fourth embodiment (FIG. 8), the amounts of the heat generated in the plural unit transistors 60 may become nonuniform. In such a case, the distribution in the amount of deviation Dx of the closest proximity cavity 45 is determined so as to cancel out the variations in the amount of heat.

The reason why the amount of the generated heat varies among the unit transistors 60 will be explained below. The collectors of the plural unit transistors 60 are connected to the same collector wiring. Under the high-frequency operation of the plural unit transistors 60, it is no longer possible to ignore the inductance components in the collector wiring. If the length of the collector wiring from the power supply terminal is different among the plural unit transistors 60, the inductance components in the collector wiring influencing the unit transistors 60 also vary. As a result, the output power and the consumed current become different among the plural unit transistors 60.

Modified examples of the fifth embodiment will be discussed below.

As described above, the provision of a harmonic terminating circuit connected to the collector of the transistor Q2 (FIG. 13) makes it more likely to vary the amount of heat among the plural unit transistors 60. If the amount of heat significantly varies among the plural unit transistors 60, the provision of the filter circuit 71 (FIG. 13) serving as a harmonic terminating circuit may be omitted.

In the fifth embodiment, a part of the matching circuit MN3 (FIG. 13) is formed on the semiconductor chip 70, and the remaining part is mounted on the mounting substrate 90 (FIG. 12). The entirety of the matching circuit MN3 may alternatively be mounted on the mounting substrate 90.

The configurations of the above-described modified examples may be employed by considering the optimal conditions for the radio-frequency characteristics and the manufacturability of the semiconductor apparatus.

Sixth Embodiment

Semiconductor apparatuses according to a sixth embodiment and modified examples thereof will be described below with reference to FIGS. 16A through 17D. An explanation of the elements configured in the same manner as those of the second embodiment will be omitted. The configuration of unit transistors 60 of the semiconductor apparatus according to the sixth embodiment is the same as the unit transistors 60 (FIG. 2) in the second embodiment or the unit transistors 60 (FIG. 7) in the third embodiment. In the sixth embodiment, the positional relationship between the operating regions 61 of the unit transistors 60 and the cavities 45 positioned immediately under the pillar bump 40 is different from that of the second and third embodiments. In the examples in FIGS. 16A through 17D, one unit transistor 60 includes one operating region 61. However, one unit transistor 60 may include two operating regions 61, such as in the second embodiment (FIG. 2).

Figure 16A:
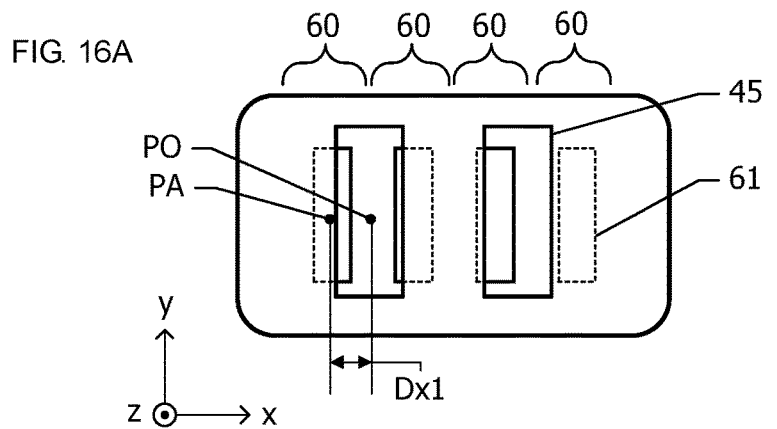
FIG. 16A illustrates the positional relationship between operating regions of unit transistors and cavities of a semiconductor apparatus according to a sixth embodiment.

FIG. 16A illustrates the positional relationship between the operating regions 61 of the unit transistors 60 and the cavities 45 in the semiconductor apparatus according to the sixth embodiment. The plural cavities 45 are disposed farther inward than the outer edges of the operating regions 61 of the unit transistors 60 positioned at both ends in the x-axis direction, and no cavities 45 are formed outside the operating regions 61 of these unit transistors 60.

The operating region 61 of the unit transistor 60 at one end (the left end) is partially covered with a cavity 45, while the operating region 61 of the unit transistor 60 at the other end (the right end) is not covered with any cavity 45.

If the heat dissipation from the operating region 61 of the unit transistor 60 at the left end is prioritized, the arrangement shown in FIG. 16A may be employed.

Figure 16B:
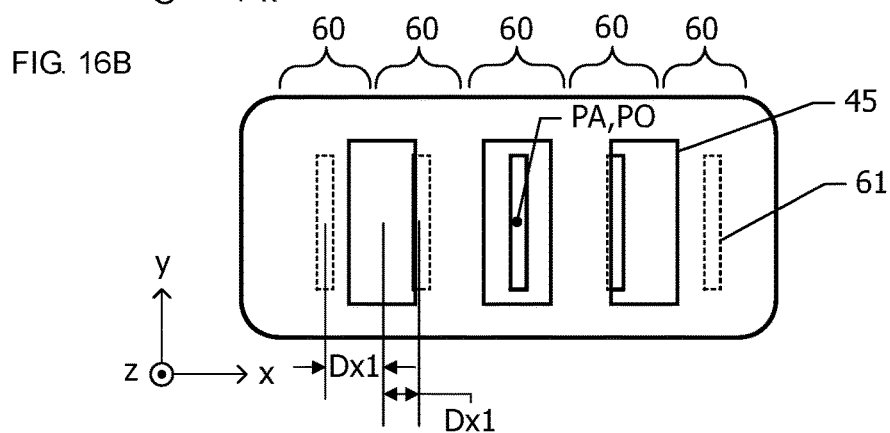
FIGS. 16B through 17D illustrate the positional relationships between the operating regions of the unit transistors and the cavities of the semiconductor apparatuses according to the modified examples of the sixth embodiment.

In the modified example in FIG. 16B, an odd number (five, for example) of unit transistors 60 are provided, and an odd number (three, for example) of cavities 45 are provided. The centroid PA of the operating region 61 of the unit transistor 60 at the center and the centroid PO of the cavity 45 at the center are set at the same position in the x-axis direction. The amount of deviation Dx of the closest proximity cavity 45 becomes greater from the center to both ends of the arrangement direction of the unit transistors 60. The heat dissipation from the unit transistors 60 at both ends is thus lower than that of the unit transistor 60 at the center.

The arrangement shown in FIG. 16B may be employed for a semiconductor apparatus in which the unit transistor 60 positioned at the center generates a relatively large amount of heat and the amount of the generated heat is decreased from the center toward the ends. The temperatures of the operating unit transistors 60 can thus be substantially equalized.

Figure 16C:
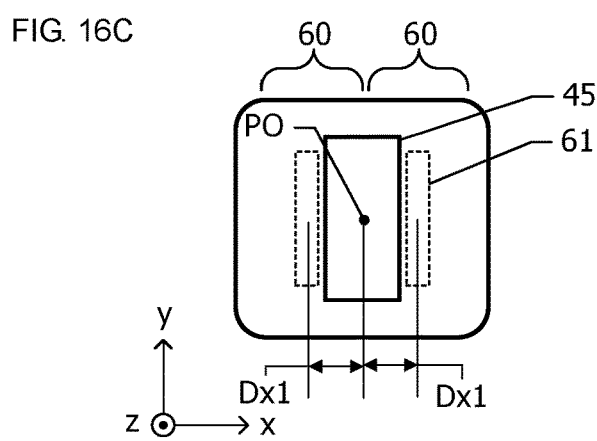

In the modified example in FIG. 16C, two unit transistors 60 and one cavity 45 are provided. The two unit transistors 60 are disposed symmetrically with each other with respect to an imaginary line passing through the centroid PO of the cavity 45 and being parallel with the y axis. Accordingly, the amount of deviation Dx of the closest proximity cavity 45 with respect to one unit transistor 60 is equal to that with respect to the other unit transistor 60. It is thus possible to make the heat dissipation from one transistor 60 and that from the other transistor 60 substantially the same. The thermal stress produced in the emitter layer 34 of one unit transistor 60 and that in the other unit transistor 60 can also be reduced almost uniformly.

Figure 16D:
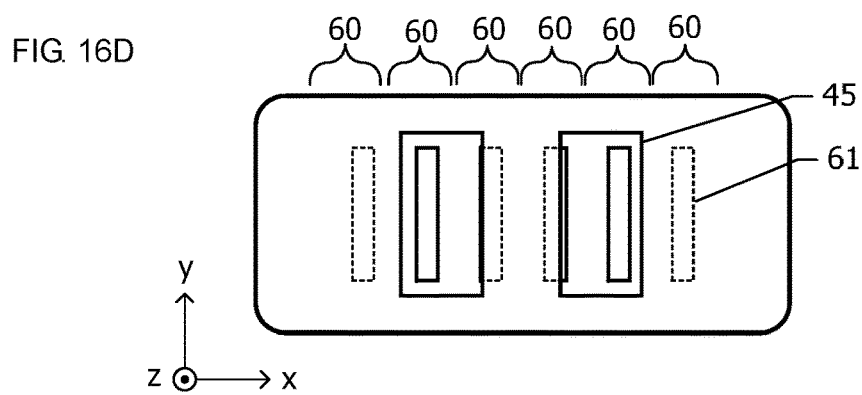

In the modified example in FIG. 16D, six unit transistors 60 and two cavities 45 are disposed. The cavities 45 are disposed farther inward than the operating regions 61 of the unit transistors 60 at both ends. The operating regions 61 of the unit transistors 60 at both ends are not covered with any cavity 45. That is, no cavities 45 are disposed immediately above the unit transistors 60 at both ends where the temperature is likely to be relatively low.

The arrangement shown in FIG. 16D may be employed when the amount of the heat generated from unit transistors 60 at both ends is smaller than that from inner-side unit transistors 60. The temperatures of the junctions of the plural unit transistors 60 can be substantially equalized.

Figure 17A:
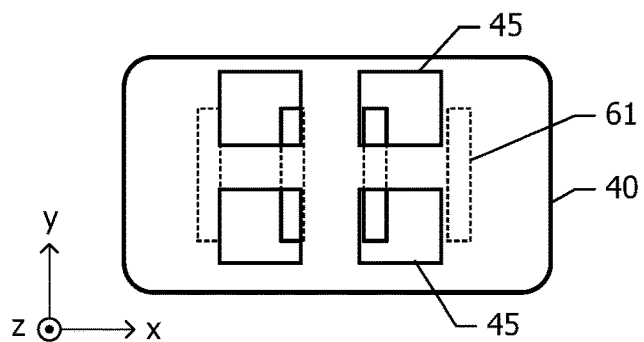

In the modified example in FIG. 17A, plural cavities 45 are arranged in a matrix in the x-axis and y-axis directions. This arrangement corresponds to the configuration in which each of the plural cavities 45 in the second embodiment is divided into two portions in the y-axis direction.

Dividing the cavity 45 in the y-axis direction decreases the area of each portion of the divided cavity 45. The sectional area of the flow channel in the heat path within the cavity 45 is accordingly decreased so as to increase the thermal resistance. This makes it easier to control the heat dissipation from the unit transistors 60. Additionally, the portion of the third-layer insulating film 52 (FIGS. 3 and 4) where the cavity 45 is formed is decreased, thereby enhancing the effect of reducing the thermal stress.

Because of the skin effect, a high-frequency signal tends to pass only on the surface of a conductor. Dividing a cavity 45 increases the surface area of a conductor within the cavity 45, thereby reducing the resistance to a high-frequency signal. Additionally, when the pillar bump 40 (FIGS. 3 and 4) is formed by plating, each cavity 45 with a reduced area can be filled with a conductor more easily. This makes it possible to enhance the flatness of the top surface of the pillar bump 40.

Although two cavities 45 are arranged in the y-axis direction in the modified example in FIG. 17A, three or more cavities 45 may be disposed. Arranging of more cavities 45 in the y-axis direction enhances the above-described effects.

Figure 17B:
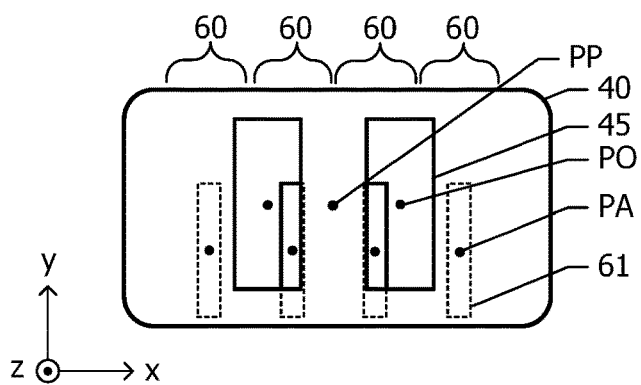

In the modified example in FIG. 17B, the centroid PO of a cavity 45 is displaced from the centroid PA of the operating region 61 of a unit transistor 60, not only in the x-axis direction, but also in the y-axis direction. The centroid PA of the operating region 61 is also displaced from the centroid PP of the pillar bump 40 in the y-axis direction. Displacing the centroid PO of the cavity 45 from the centroid PA of the operating region 61, not only in the x-axis direction, but also in the y-axis direction makes it more likely to increase the thermal resistance in the area from the operating region 61 to the pillar bump 40. It is thus possible to more easily adjust the heat dissipation from the unit transistors 60 and also to reduce the thermal stress.

Figure 17C:
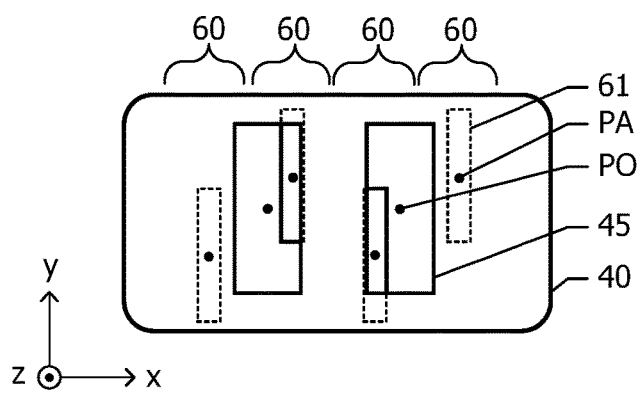

In the modified example in FIG. 17C, the centroids PA of the operating regions 61 of plural unit transistors 60 are disposed in staggered arrangement. More specifically, among the plural unit transistors 60 arranged in the x-axis direction, the centroids PA of the operating regions 61 of the odd-numbered unit transistors 60 are disposed on a straight line in the x-axis direction. Likewise, the centroids PA of the operating regions 61 of the even-numbered unit transistors 60 are disposed on another straight line in the x-axis direction. The centroids PA of the operating regions 61 of the odd-numbered unit transistors 60 and those of the even-numbered unit transistors 60 are located at different positions in the y-axis direction.

The centroid PO of each cavity 45 is displaced from the centroid PA of any of the operating regions 61 in the x-axis direction and in the y-axis direction. Advantages similar to those of the example in FIG. 17B are thus achieved.

Figure 17D:
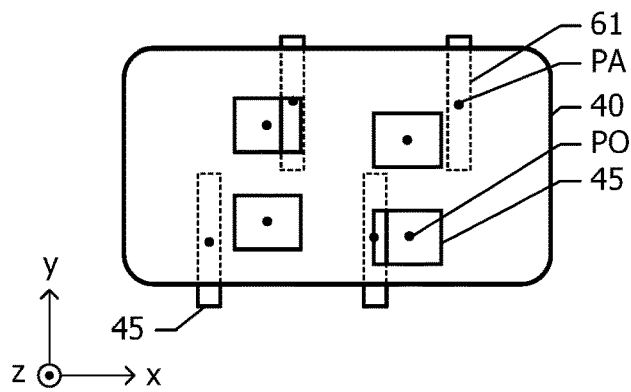

In the modified example in FIG. 17D, the pitch between the centroids PA of the operating regions 61 disposed in staggered arrangement is greater than that in the example in FIG. 17C. Each operating region 61 partially extends to the outside of the pillar bump 40, as viewed from above. To avoid a significant increase in thermal resistance, each operating region 61 partially overlaps with the pillar bump 40. Each cavity 45 is divided into two portions in the y-axis direction. The centroid PO of each cavity 45 is displaced from the centroid PA of any of the operating regions 61 in the x-axis direction and in the y-axis direction. Advantages similar to those of the example in FIG. 17B are thus achieved.

Seventh Embodiment

A semiconductor apparatus according to a seventh embodiment will be described below with reference to FIG. 18. An explanation of the elements configured in the same manner as those of the second embodiment (FIGS. 2 through 4) will be omitted.

Figure 18:
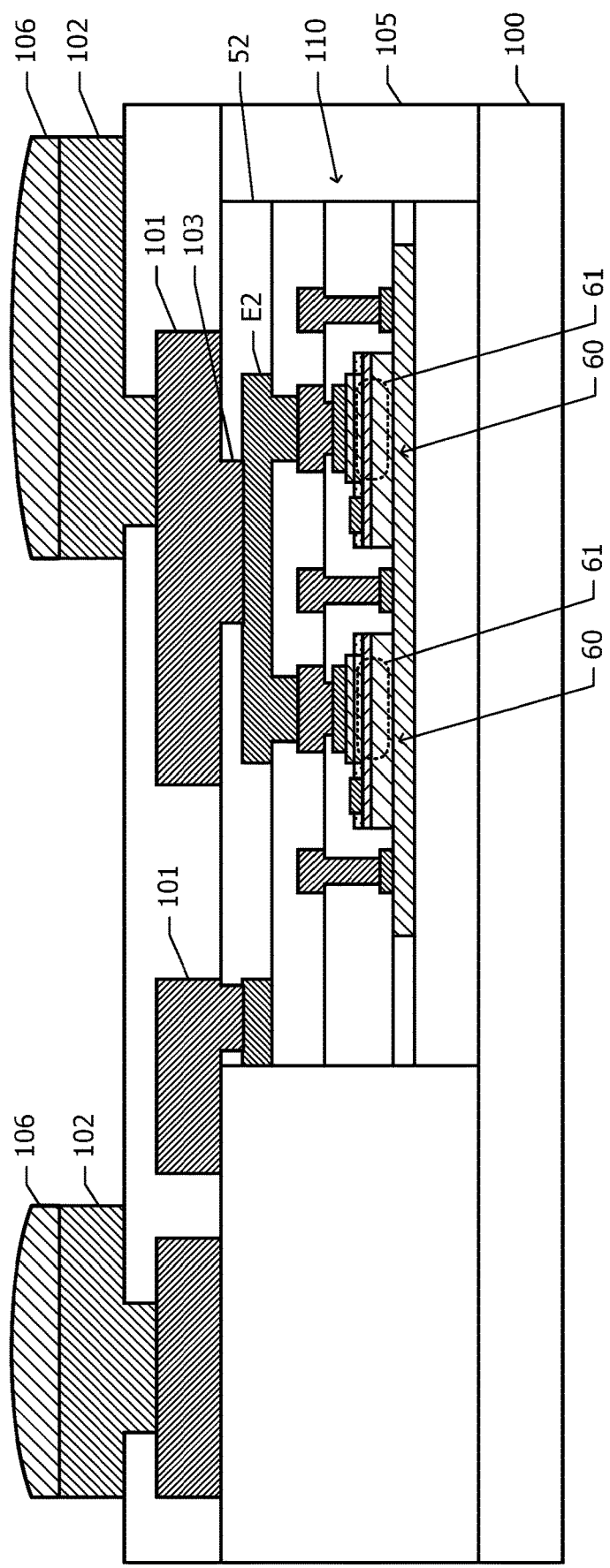
FIG. 18 is a sectional view of a semiconductor apparatus according to a seventh embodiment.

FIG. 18 is a sectional view of the semiconductor apparatus according to the seventh embodiment. In the second embodiment, the pillar bump 40 (FIGS. 3 and 4) is formed on the top surface of the semiconductor chip on which the unit transistors 60 are formed. The semiconductor apparatus of the seventh embodiment is implemented by using a wafer-level package including a semiconductor chip.

On a package substrate 100, a semiconductor chip 110 is bonded and fixed. The semiconductor chip 110 includes a device structure from the substrate 30 to the second-layer emitter wiring E2 of the semiconductor apparatus (FIGS. 2 through 4) of the second embodiment, for example, and also includes the third-layer insulating film 52 covering the second-layer emitter wiring E2. The semiconductor chip 110 includes plural unit transistors 60. Apart from the semiconductor chip 110, surface mounting devices are bonded and fixed on the package substrate 100.

The semiconductor chip 110 and the surface mounting devices are sealed with a resin insulating film 105. The top surface of the semiconductor chip 110 is on the same level as that of the insulating film 105. On the semiconductor chip 110 and the insulating film 105, plural first-layer redistribution lines 101 are disposed. A part of the first-layer redistribution line 101 is electrically connected to the second-layer emitter wiring E2 underneath via a cavity 103 formed in the third-layer insulating film 52. Plural second-layer redistribution lines 102 are disposed on the first-layer redistribution lines 101. The second-layer redistribution lines 102 are electrically connected to terminals 106, such as bumps, disposed thereon. The first-layer redistribution lines 101 and the second-layer redistribution lines 102 are formed by plating using Cu, for example.

The positional relationships among the first-layer redistribution lines 101, the cavities 103, and the operating regions 61 of the unit transistors 60 in a plan view is substantially equivalent to those among the pillar bump 40, the cavities 45, and the operating regions 61 of the unit transistors 60 of the semiconductor apparatus of the second embodiment.

Advantages achieved by the configuration of the semiconductor apparatus according to the seventh embodiment will be discussed below.

In the seventh embodiment, the first-layer redistribution lines 101 have a function similar to the pillar bump 40 (FIGS. 2 through 4) of the second embodiment. That is, the first-layer redistribution lines 101 serve as a heat path for dissipating the heat generated in the operating regions 61 to the outside. The cavity 103 for connecting the first-layer redistribution line 101 and the second-layer emitter wiring E2 has a function similar to the cavity 45 (FIGS. 2 through 4) in the second embodiment. The first-layer redistribution lines 101, the cavities 103, and the operating regions 61 of the unit transistors 60 are arranged with the above-described positional relationships, thereby achieving advantages similar to those of the second embodiment.

The positional relationships among the first-layer redistribution lines 101, the cavities 103, and the operating regions 61 of the unit transistors 60 may alternatively be set, as in one of the third through sixth embodiments. In this case, advantages similar to those of the corresponding one of the third through sixth embodiments are achieved.

Eighth Embodiment

A semiconductor apparatus according to an eighth embodiment will be described below with reference to FIG. 19. An explanation of the elements configured in the same manner as those of the seventh embodiment (FIG. 18) will be omitted.

Figure 19:
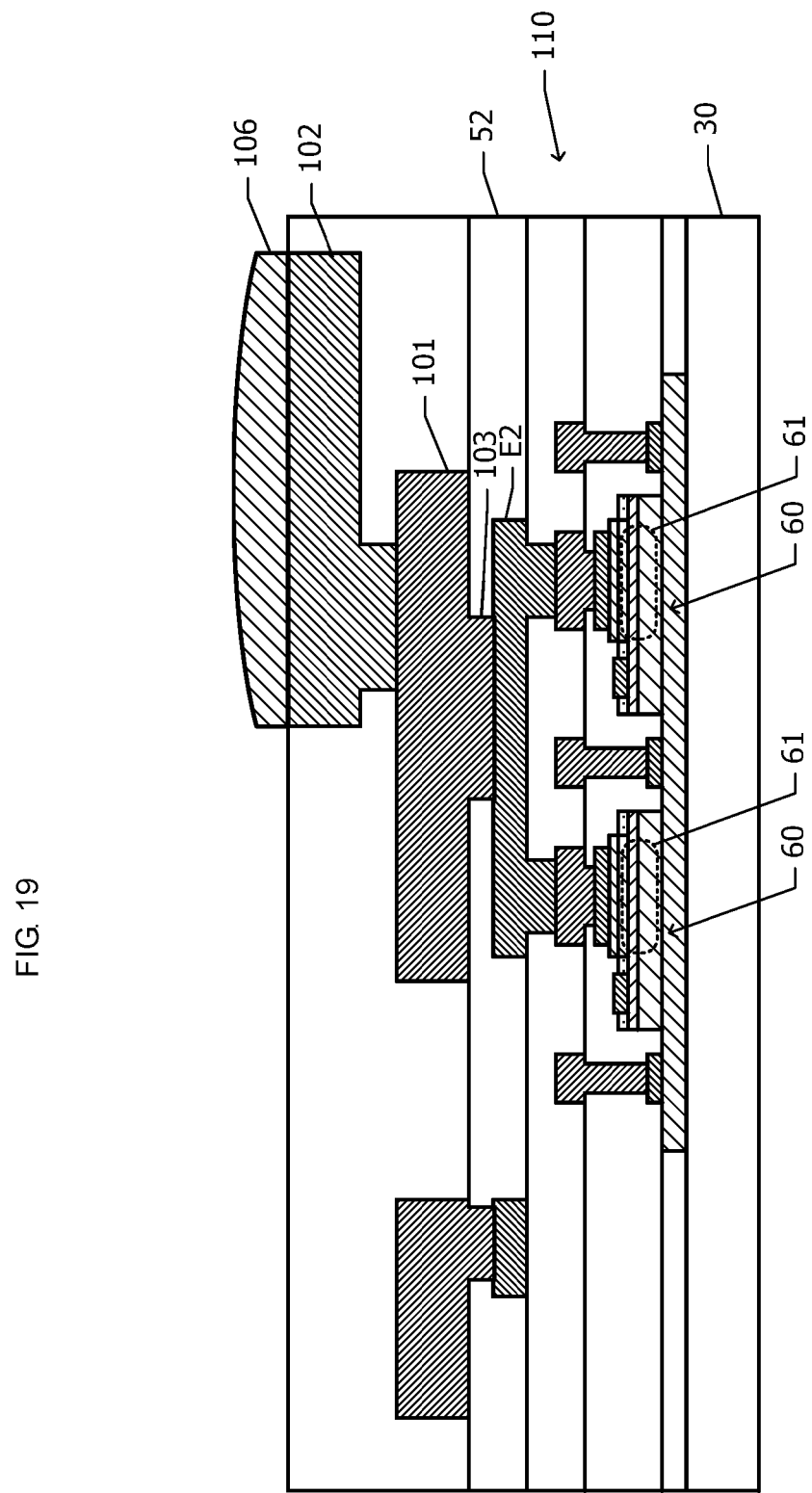
FIG. 19 is a sectional view of a semiconductor apparatus according to an eighth embodiment.

FIG. 19 is a sectional view of the semiconductor apparatus according to the eighth embodiment. In the seventh embodiment, the semiconductor chip 110 is bonded to the package substrate 100, and the first-layer and second-layer redistribution lines 101 and 102 are formed above the package substrate 100, as shown in FIG. 18. In the eighth embodiment, the first-layer and second-layer redistribution lines 101 and 102 are formed on the third-layer (the uppermost-layer) insulating film 52 of the semiconductor chip 110. An external connection terminal 106 is disposed on the second-layer redistribution line 102. The first-layer redistribution line 101 is electrically connected to the second-layer emitter wiring E2 via the cavity 103 formed in the third-layer insulating film 52.

In the eighth embodiment, as well as in the seventh embodiment, the positional relationships among the first-layer redistribution line 101, the cavity 103, and the operating regions 61 of the unit transistors 60 are set to be the same as those of the semiconductor apparatus of the seventh embodiment. Advantages similar to those of the seventh embodiment are thus achieved.

Ninth Embodiment

A semiconductor apparatus according to a ninth embodiment will be described below with reference to FIGS. 20 through 22. An explanation of the elements configured in the same manner as those of the second embodiment will be omitted. The semiconductor apparatus of the ninth embodiment includes an HBT having a base layer made of SiGe.

Figure 20:
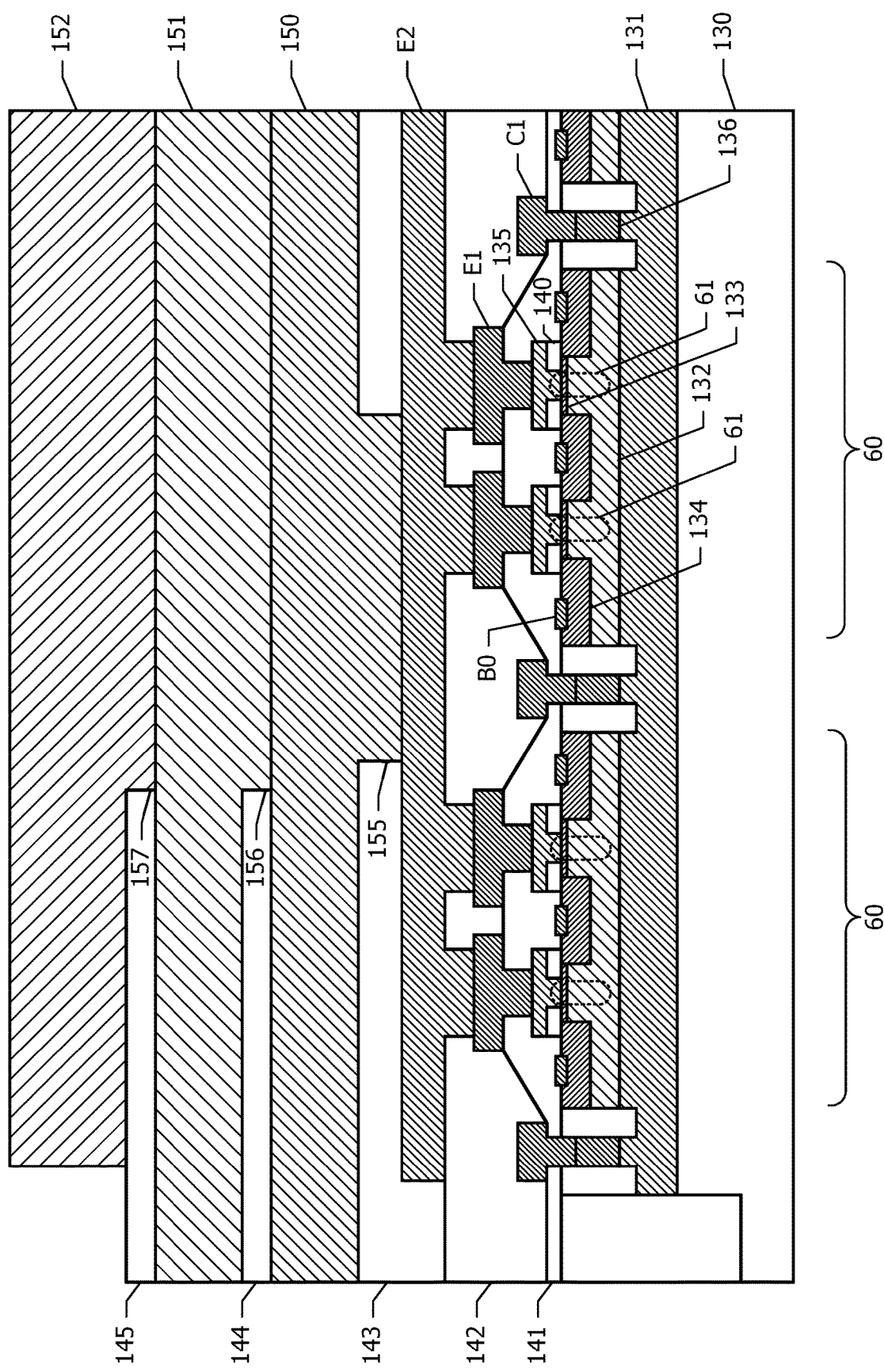
FIG. 20 is a sectional view of a semiconductor apparatus according to a ninth embodiment.

FIG. 20 is a sectional view of the semiconductor apparatus according to the ninth embodiment. In the second embodiment, GaAs is used for the base layer 33, and InGaP is used for the emitter layer 34. In the ninth embodiment, SiGe is used for the base layer 33.

On the front layer of a substrate 130 made of p-type Si, a sub-collector layer 131 made of high-concentration n-type Si is disposed, and a collector layer 132 made of n-type Si is disposed on the sub-collector layer 131. On the collector layer 132, base layers 133 made of epitaxially grown SiGe are disposed.

Because of a shallow trench isolation structure in the area from the top surface of the base layers 133 until the position slightly deeper than the top surface of the sub-collector layer 131, multiple active regions are defined, and a unit transistor 60 is disposed in each of the active regions. Because of the shallow trench isolation structure which reaches the bottom surface of the sub-collector layer 131, the plural unit transistors 60 are electrically isolated from the peripheral circuits. The cross-sectional view of FIG. 20 shows two unit transistors 60.

A p-type external base layer 134 is formed on the front layer of part of the active region. The external base layer 134 surrounds the base layer 133 made of p-type SiGe, as viewed from above. In one active region, two base layers 133 are disposed.

An insulating film 140 made of silicon oxide, for example, is formed on each of the base layers 133, and an emitter layer 135 made of n-type polysilicon, for example, is disposed on the insulating film 140. The emitter layer 135 contacts with the base layer 133 via a cavity formed in the insulating film 140. The operating current flows in the thickness direction of a heterojunction between the emitter layer 135 and the base layer 133. The outer edge lines of this heterojunction define the operating region 61, as viewed from above. Each unit transistor 60 includes two operating regions 61.

The base electrode B0 is disposed on the front surface of the external base layer 134. The base electrode B0 is made of Ti silicide or Ni silicide, for example. The base electrode B0 is provided for reducing the base resistance. If the base resistance is sufficiently low without the base electrode B0, the provision of the base electrode B0 may be omitted.

A first-layer insulating film 141 made of silicon oxide, for example, is disposed to cover the emitter layers 135, the external base layer 134, and the base electrode B0. The first-layer emitter wirings E1 and a first-layer collector wiring C1 made of Al, for example, are formed on the first-layer insulating film 141. The first-layer emitter wiring E1 is electrically connected to the emitter layer 135 via a cavity formed in the first-layer insulating film 141. The first-layer collector wiring C1 is electrically connected to the sub-collector layer 131 via a cavity formed in the first-layer insulating film 141 and a high-concentration n-type region 136 formed above the front surface of the substrate. To reduce the collector resistance, a collector electrode made of metal silicide may be disposed at the interface between the first-layer collector wiring C1 and the n-type region 136.

The base electrode B0 is connected to the first-layer base wiring B1 at a portion which is not seen in the sectional view of FIG. 20.

A second-layer insulating film 142 made of silicon oxide or silicon nitride, for example, is disposed on the first-layer insulating film 141 to cover the first-layer emitter wirings E1 and the first-layer collector wiring C1. On the second-layer insulating film 142, the second-layer emitter wiring E2 is disposed. The second-layer emitter wiring E2 is electrically connected to the first-layer emitter wirings E1 via cavities formed in the second-layer insulating film 142 so as to connect the emitter layers 135 of the plural unit transistors 60.

On the second-layer emitter wiring E2, a third-layer insulating film 143, a third-layer wiring 150, a fourth-layer insulating film 144, a fourth-layer wiring 151, and a fifth-layer insulating film 145 are disposed in this order. The third-layer wiring 150 is electrically connected to the second-layer emitter wiring E2 via a cavity 155 formed in the third-layer insulating film 143. The fourth-layer wiring 151 is electrically connected to the third-layer wiring 150 via a cavity 156 formed in the fourth-layer insulating film 144. A bump 152 is disposed on the fifth-layer insulating film 145. The bump 152 is electrically connected to the fourth-layer wiring 151 via a cavity 157 formed in the fifth-layer insulating film 145. The second-layer emitter wiring E2, the third-layer wiring 150, and the fourth-layer wiring 151 are made of Al or Cu, for example. The third-layer, fourth-layer, and fifth-layer insulating films 143, 144, and 145 are formed of silicon oxide or silicon nitride, for example.

The top surface of each of the second-layer through fifth-layer insulating films 142 through 145 is flattened. The top surface of the first-layer insulating film 141 may also be flattened if necessary.

Figure 21:
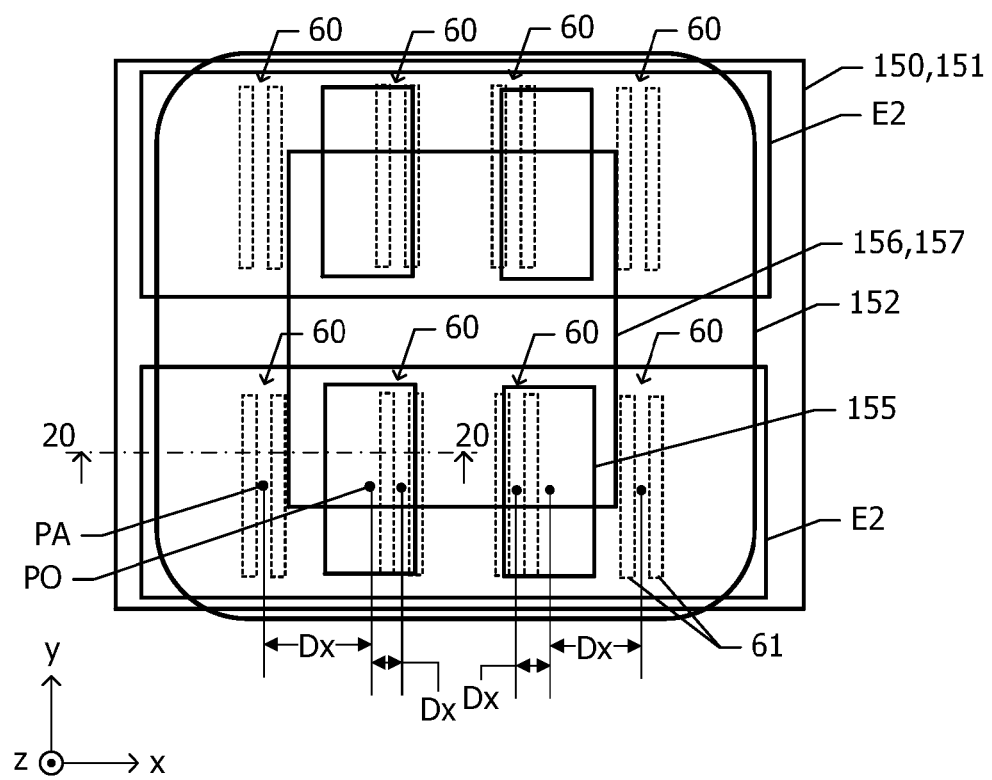
FIG. 21 is a plan view illustrating the layout of the elements forming the semiconductor apparatus of the ninth embodiment.

FIG. 21 is a plan view illustrating the layout of the elements forming the semiconductor apparatus of the ninth embodiment. A sectional view taken along the long-dashed dotted line 20-20 in FIG. 21 corresponds to that shown in FIG. 20. Eight unit transistors 60 are arranged in a matrix of two rows and four columns, assuming that the row direction is the x-axis direction and the column direction is the y-axis direction. Each unit transistor 60 includes two operating regions 61. Each operating region 61 has a planar configuration elongated in the y-axis direction, as viewed from above. Within one unit transistor 60, two operating regions 61 are arranged side by side in the x-axis direction.

The second-layer emitter wiring E2 is disposed for each row constituted by four unit transistors 60. The second-layer emitter wiring E2 contains the operating regions 61 of the unit transistors 60 of the corresponding row therein, as viewed from above.

The third-layer wiring 150, the fourth-layer wiring 151, and the bump 152 are disposed to cover all the operating regions 61 of the eight unit transistors 60, as viewed from above. Four cavities 155 formed in the third-layer insulating film 143 (FIG. 20) are disposed in a matrix of two rows and two columns. One row of two cavities 155 corresponds to one row of four unit transistors 60.

With respect to an imaginary line passing through the center of the bump 152 and being parallel with the x axis, the operating regions 61 of the unit transistors 60 of the first row and those of the second row are disposed symmetrically with each other. Similarly, the cavities 155 of the first row and those of the second row are disposed symmetrically with each other with respect to this imaginary line.

The centroid PO of each cavity 155 is displaced from the centroid PA of the operating regions 61 of the corresponding unit transistor 60 in the x-axis direction. Focusing on each row of unit transistors 60, the amounts of deviation Dx of the closest proximity cavities 155 with respect to the unit transistors 60 at both ends are greater than those with respect to the inner-side unit transistors 60, as in the second embodiment (FIG. 2).

The cavity 156 formed in the fourth-layer insulating film 144 (FIG. 20) and the cavity 157 formed in the fifth-layer insulating film 145 (FIG. 20) have the same configuration and the same dimensions, and overlap with each other substantially perfectly as viewed from above. The cavities 156 and 157 are disposed farther inward than the operating regions 61 at both ends in the x-axis direction, and partially overlap with some operating regions 61 of the unit transistors 60 of the first row and also those of the second row in the y-axis direction.

Figure 22:
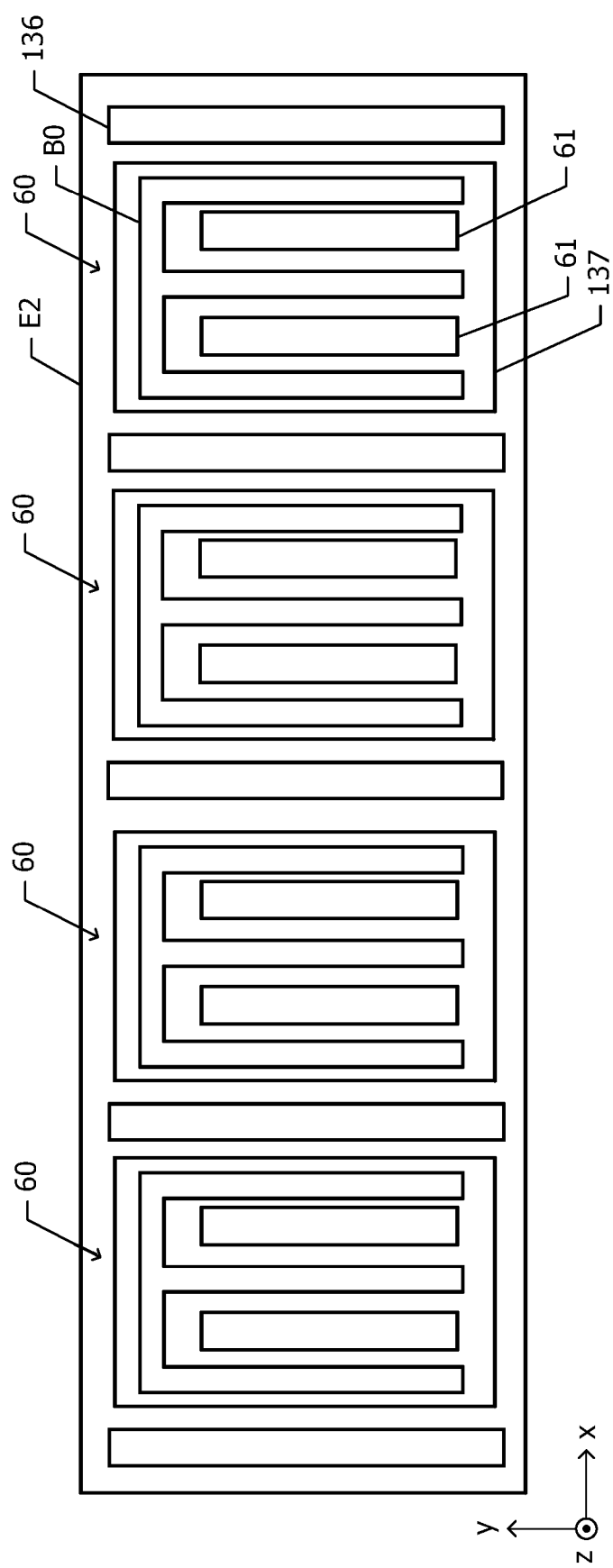
FIG. 22 is a plan view illustrating the layout of four unit transistors disposed in one row in the semiconductor apparatus of the ninth embodiment.

FIG. 22 is a plan view illustrating the layout of four unit transistors 60 disposed in one row in the semiconductor apparatus of the ninth embodiment. Each unit transistor 60 includes two operating regions 61 disposed with a space therebetween in the x-axis direction. The base electrode B0 has an interdigital configuration having three teeth portions, as viewed from above. One of the three teeth portions of the base electrode B0 is located between the two operating regions 61 and the other two teeth portions are located outside the operating regions 61. The area where the base layers 133 and the external base layer 134 (FIG. 20) are combined with each other are defined by outer edge lines 137. The two operating regions 61 and the base electrode B0 are disposed within the outer edge lines 137.

Some n-type regions 136 are disposed between the unit transistors 60 arranged in the x-axis direction, and two n-type regions 136 are also disposed outside the unit transistors 60 at both ends. The second-layer emitter wiring E2 is disposed and contains the unit transistors 60 and the n-type regions 136 therein, as viewed from above.

Advantages achieved by the configuration of the semiconductor apparatus according to the ninth embodiment will be discussed below.

The cavities 155 connecting the second-layer emitter wiring E2 and the third-layer wiring 150 serve as a heat path for dissipating the heat generated in the operating regions 61 to the outside. From this point of view, the cavities 155 correspond to the cavities 45 in the semiconductor apparatus of the second embodiment (FIG. 2).

In the ninth embodiment, the centroid PO of each cavity 155 is displaced from the centroid PA of the corresponding operating region 61 in the x-axis direction. Advantages similar to those of the second embodiment are thus achieved.

Tenth Embodiment

A semiconductor apparatus according to a tenth embodiment will be described below with reference to FIGS. 23 and 24. An explanation of the elements configured in the same manner as those of the second embodiment will be omitted. In the second embodiment, the unit transistors 60 (FIGS. 2 through 4) are HBTs. In the tenth embodiment, the unit transistors 60 are metal-oxide-semiconductor field-effect transistors (MOSFETs).

Figure 23:
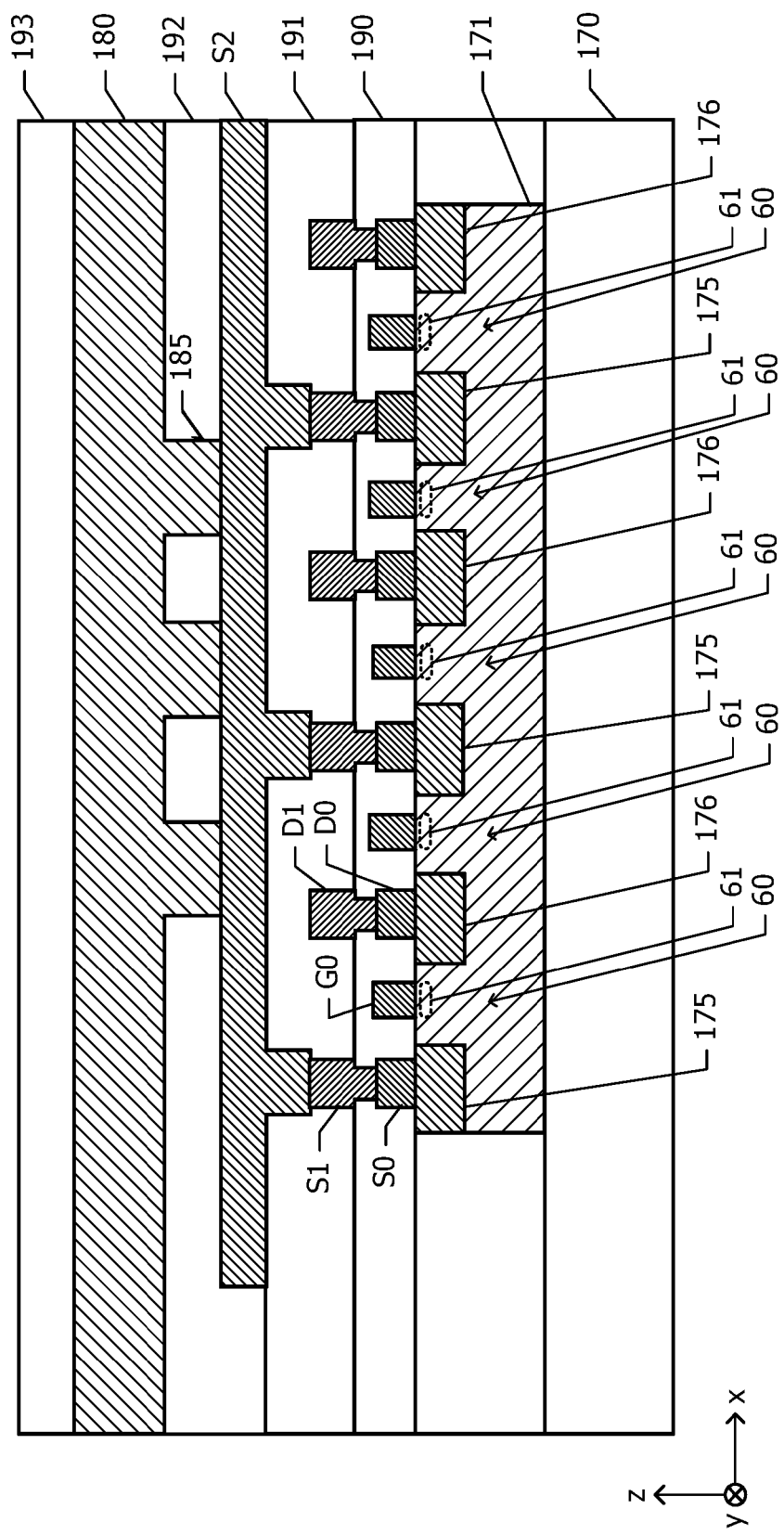
FIG. 23 is a sectional view of a semiconductor apparatus according to a tenth embodiment.

FIG. 23 is a sectional view of the semiconductor apparatus according to the tenth embodiment. On the front surface of a silicon substrate 170, an active region 171 separated by a shallow trench isolation structure is formed. Plural unit transistors 60 are arranged in the x-axis direction within the active region 171. In the tenth embodiment in FIG. 23, five unit transistors 60 are disposed. The unit transistors 60 are all MOSFETs and each include a source region 175 and a drain region 176 disposed with a space therebetween in the x-axis direction. A gate electrode G0 is disposed on a channel region between the source region 175 and the drain region 176. A source electrode S0 and a drain electrode D0 are electrically connected to the source region 175 and the drain region 176, respectively. Concerning the source regions 175 and the drain regions 176 other than those at both ends, two adjacent unit transistors 60 use the same source region 175 or the same drain region 176. A part of the active region 171 immediately under the gate electrode G0 serves as an operating region 61. The operating current flows through the operating region 61 in the in-plane direction.

A first-layer insulating film 190 is disposed to cover the unit transistors 60. On the first-layer insulating film 190, first-layer source wirings S1 and first-layer drain wirings D1 made of Al, for example, are disposed. The first-layer source wiring S1 is electrically connected to the source region 175 via a cavity formed in the first-layer insulating film 190 and the source electrode S0. The first-layer drain wiring D1 is electrically connected to the drain region 176 via a cavity formed in the first-layer insulating film 190 and the drain electrode D0.

A second-layer insulating film 191 is disposed to cover the first-layer source wirings S1 and the first-layer drain wirings D1. On the second-layer insulating film 191, a second-layer source wiring S2 is disposed. The second-layer source wiring S2 is electrically connected to the plural first-layer source wirings S1 via cavities formed in the second-layer insulating film 191.

A third-layer insulating film 192 is disposed to cover the second-layer source wiring S2. On the third-layer insulating film 192, a third-layer wiring 180 is disposed. The third-layer wiring 180 is electrically connected to the second-layer source wiring S2 via plural cavities 185 formed in the third-layer insulating film 192. A fourth-layer insulating film 193 is disposed to cover the third-layer wiring 180.

The second-layer source wiring S2 and the third-layer wiring 180 are made of Al or Cu, for example. The first through fourth insulating films 190 through 193 are formed of silicon oxide or silicon nitride, for example.

Figure 24:
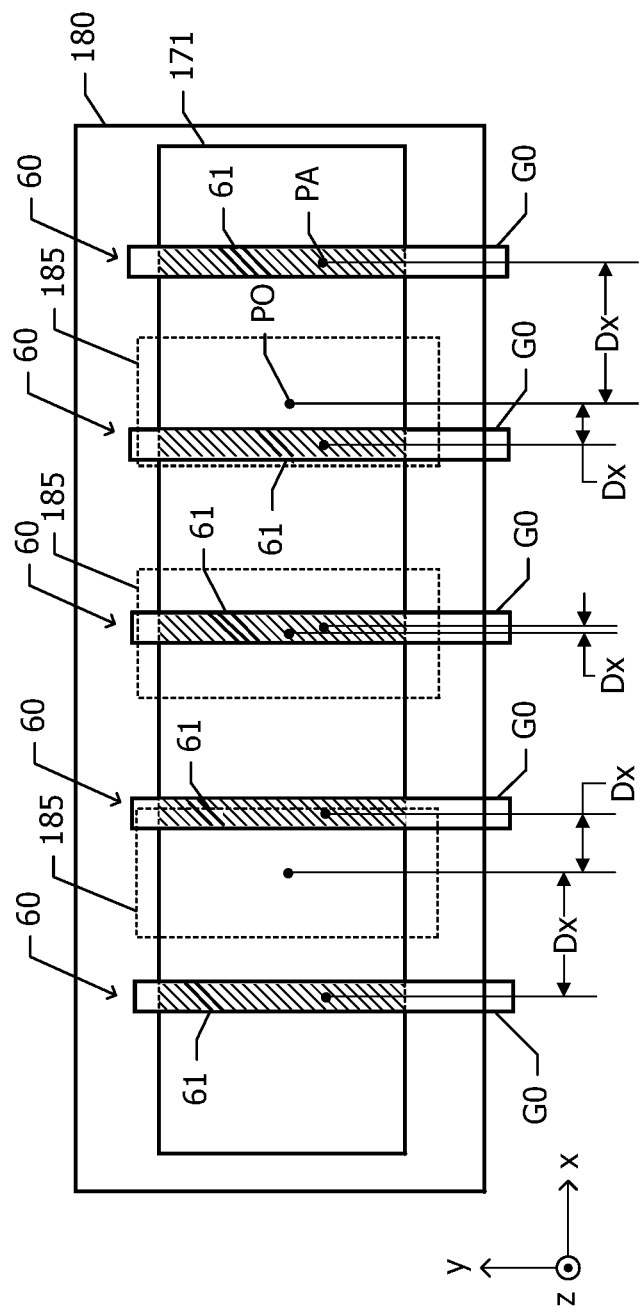
FIG. 24 is a plan view illustrating the layout of the elements forming the semiconductor apparatus according to the tenth embodiment.

FIG. 24 is a plan view illustrating the layout of the elements forming the semiconductor apparatus according to the tenth embodiment. Five gate electrodes G0 arranged in the x-axis direction intersect the active region 171 formed in a substantially rectangular shape elongated in the x-axis direction. The gate electrodes G0 have a planar configuration elongated in the y-axis direction and pass through the active region 171 in the y-axis direction. The portions where the active region 171 and the gate electrodes G0 overlap with each other (indicated by the hatched portions in FIG. 24) serve as the operating regions 61.

The third-layer wiring 180 is disposed to cover all the operating regions 61, as viewed from above. The three cavities 185 are provided in the x-axis direction within the third-layer wiring 180, as viewed from above. The centroid PO of each cavity 185 is displaced from the centroid PA of the corresponding operating region 61 in the x-axis direction. The amount of deviation Dx of the closest proximity cavity 185 becomes greater from the center to both ends of the arrangement direction of the operating regions 61 in the x-axis direction.

Arranging the positional relationship between the operating regions 61 and the cavities 185 as described above achieves advantages similar to those of the second embodiment. That is, the thermal stress produced in the semiconductor portions of the unit transistors 60 can be reduced, and the temperatures of the operating plural unit transistors 60 can be substantially equalized. As a result, it is possible to improve the radio-frequency characteristics of the overall transistor circuit constituted by the plural unit transistors 60 connected in parallel with each other.

Although a silicon substrate is used as the substrate 170 in the tenth embodiment, a substrate made of a compound semiconductor may be used. For example, a GaAs substrate may be used as the substrate 170, and the unit transistors 60 may be each constituted by a high-electron-mobility transistor (HEMT) having a channel made of InGaAs. The unit transistors 60 may alternatively be constituted by HEMTs on a GaN substrate.

Eleventh Embodiment

A semiconductor apparatus according to an eleventh embodiment will be described below with reference to FIGS. 25A and 25B. An explanation of the elements configured in the same manner as those of the second embodiment will be omitted. In the eleventh embodiment, the structure of the semiconductor apparatus is simplified, and the simulations were conducted to find a decrease in thermal stress produced in the operating regions 61 by changing the material and the thickness of the insulating film 52 (FIG. 3).

The planar configuration and the positional relationships among an operating region 61, a pillar bump 40, and a cavity 45 of a semiconductor apparatus used for the simulations are the same as those of the semiconductor apparatus shown in FIG. 5B. In the simulations, the amount of deviation Dx was fixed at about 20 μm.

Figure 25A:
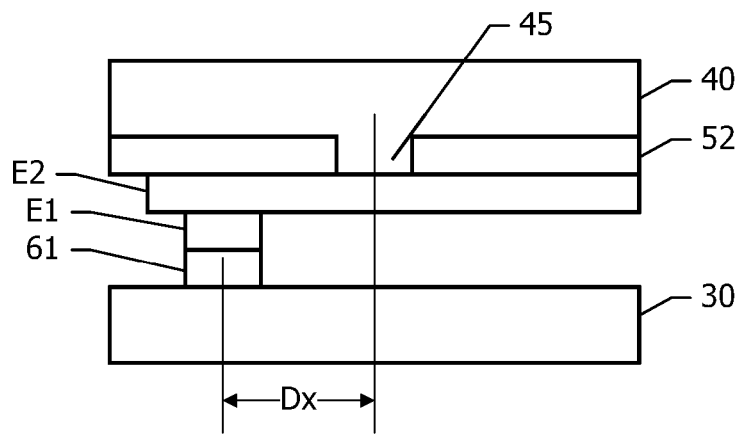
FIG. 25A is a sectional view of a semiconductor apparatus used for the simulations in an eleventh embodiment.

FIG. 25A is a sectional view of the semiconductor apparatus used for the simulations. The operating region 61 made of GaAs is formed on a part of a substrate 30 made of GaAs. A first-layer emitter wiring E1 is disposed on the operating region 61. A second-layer emitter wiring E2 is disposed on the first-layer emitter wiring E1. The second-layer emitter wiring E2 extends in the in-plane direction.

An insulating film 52 is disposed on the second-layer emitter wiring E2. A cavity 45 is formed in the insulating film 52. The cavity 45 is horizontally displaced from the operating region 61. A pillar bump 40 is disposed within the cavity 45 and on the insulating film 52. The first-layer and second-layer emitter wirings E1 and E2 are made of Au, and the pillar bump 40 is made of Cu.

The simulations were conducted by using four samples A, B, C, and D. The structures of the insulating films 52 used for four samples A, B, C, and D are different. The insulating film 52 of sample A is a SiN film having a thickness of about 0.5 µm. The insulating film 52 of sample B has a double-layer structure constituted by a SiN film having a thickness of about 0.5 µm and a Benzocyclobutene (BCB) film having a thickness of about 5 µm stacked on each other in this order. The insulating film 52 of sample C is a BCB film having a thickness of about 0.5 µm. The insulating film 52 of sample D is a BCB film having a thickness of about 5.5 µm.

Figure 25B:
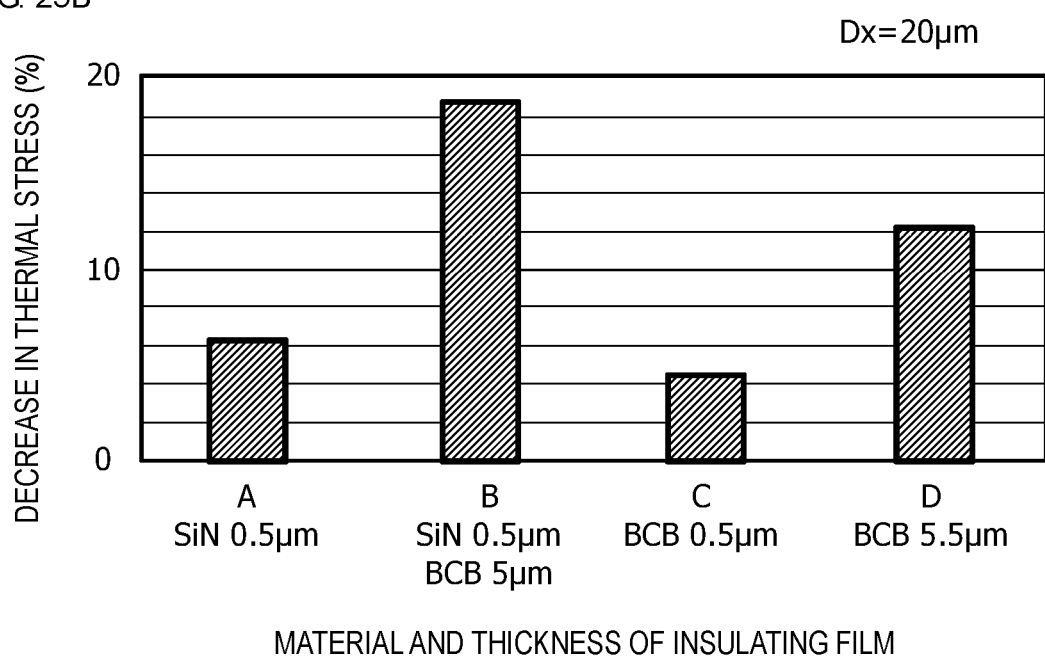
FIG. 25B is a graph illustrating the relationship between the maximum value of a decrease in the thermal stress produced in an operating region of each of the samples and the material and thickness of an insulating film.

FIG. 25B is a graph illustrating the relationship between the maximum value of a decrease in thermal stress produced in the operating region 61 of each of samples A, B, C, and D and the material and thickness of an insulating film. The vertical axis of the graph indicates a decrease in thermal stress by "%". The value of thermal stress produced in the semiconductor apparatus shown in FIG. 5B when the amount of deviation Dx is 0 is set as a reference value. A decrease in thermal stress is represented by the ratio of the amount of decrease from the reference value to the reference value.

The simulation result of sample A in FIG. 25B shows that the use of a SiN film for the insulating film 52 can reduce the thermal stress produced in the operating region 61. The reason why the effect of reducing the thermal stress is exhibited will be explained below.

The coefficient of thermal expansion of a metal, such as Cu or Al, used for the pillar bump 40 or the redistribution lines 101 (FIGS. 18 and 19) is about 20 ppm/° C. The coefficient of thermal expansion of the substrate 30 or the operating region 61 constituted by a semiconductor is about 6 ppm/° C. if the semiconductor is made of GaAs and is about 2.6 ppm/° C. if the semiconductor is made of Si. The coefficient of thermal expansion of the pillar bump 40 or the redistribution lines 101 is greater than that of the substrate 30 or the operating region 61. Because of this difference in the coefficient of thermal expansion, the thermal stress is produced.

The insulating film 52 having a coefficient of thermal expansion smaller than or equal to that of the operating region 61 is disposed between the pillar bump 40 or the redistribution lines 101 and the operating region 61. This can reduce the thermal stress produced in the operating region 61. Examples of materials having a coefficient of thermal expansion smaller than or equal to that of the substrate 30 or the operating region 61 made of a semiconductor are SiN, SiO, and inorganic insulating materials.

The simulation results of samples C and D in FIG. 25B show that the use of a BCB film for the insulating film 52 can reduce the thermal stress produced in the operating region 61. The reason why the effect of reducing the thermal stress is exhibited will be explained below.

When the pillar bump 40 and the substrate 30 thermally expand, distortion occurs because of the difference in the coefficient of thermal expansion therebetween. Such distortion concentrates on the insulating film 52 having a low Young's modulus. For example, the Young's modulus of the substrate 30 made of GaAs is about 83 GPa and that of the insulating film 52 made of BCB is about 2.9 GPa. Distortion thus concentrates on the insulating film 52, which reduces the distortion and thermal stress produced in the operating region 61. To reduce the thermal stress in the operating region 61, a material having a Young's modulus lower than that of the substrate 30 is used for the insulating film 52. To sufficiently exhibit the effect of reducing the thermal stress, a material having a Young's modulus of about 3 GPa or lower is preferably used for the insulating film 52. Examples of such a material are BCB, polyimide, and other resin insulating materials. Increasing the thickness of a BCB film further enhances the effect of reducing the thermal stress.

The simulation result of sample B in FIG. 25B shows that the use of a double layer film constituted by a film having a coefficient of thermal expansion smaller than or equal to that of the semiconductor substrate 30 and a film having a Young's modulus lower than that of the substrate 30 for the insulating film 52 can further enhance the effect of reducing the thermal stress.

Twelfth Embodiment

Semiconductor apparatuses according to a twelfth embodiment and modified examples thereof will be described below with reference to FIGS. 26A through 27B. An explanation of the elements configured in the same manner as those of the second embodiment will be omitted.

Figure 26A:
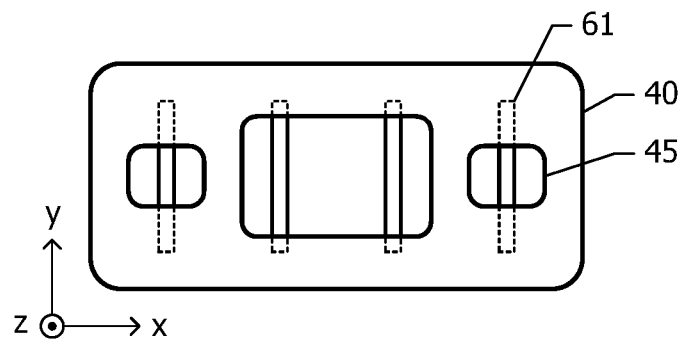
FIG. 26A illustrates the positional relationships among a pillar bump, cavities, and operating regions of a semiconductor apparatus according to a twelfth embodiment.

FIG. 26A illustrates the positional relationships among a pillar bump 40, cavities 45, and operating regions 61 of the semiconductor apparatus according to the twelfth embodiment. The plural operating regions 61 are entirely disposed within the pillar bump 40. Each of the operating regions 61 is partially disposed within the corresponding cavity 45 and is partially disposed outside the corresponding cavity 45. Concerning the proportion of the area of the portions of the operating region 61 disposed outside the corresponding cavity 45, the proportion for the operating regions 61 positioned at both ends in the x-axis direction is higher than that for the inner-side operating regions 61. The insulating film 52 (FIG. 3) intervenes between the pillar bump 40 and the operating regions 61 outside the cavities 45. As the proportion of the portion of the operating region 61 disposed outside the cavity 45 is higher, the effect of reducing the thermal stress is further enhanced.

The thermal stress produced in the operating regions 61 positioned at both ends in the x-axis direction due to the difference in the coefficient of thermal expansion tends to be greater than that in the inner-side operating regions 61. In the twelfth embodiment in FIG. 26A, the proportion of the portion of the operating region 61 outside the corresponding cavity 45 is relatively high for the operating regions 61 at both ends. It is thus possible to enhance the effect of reducing the thermal stress in the operating regions 61 at both ends where thermal stress is likely to occur.

During the operation of the transistor units 60, the inner-side operating regions 61 are more likely to be at high temperature than those at both ends. In the twelfth embodiment, the proportion of the portion of the operating region 61 disposed within the cavity 45 is relatively high for the inner-side operating regions 61, so that sufficient heat dissipation is achieved in the region where the temperature is likely to rise.

Figure 26B:
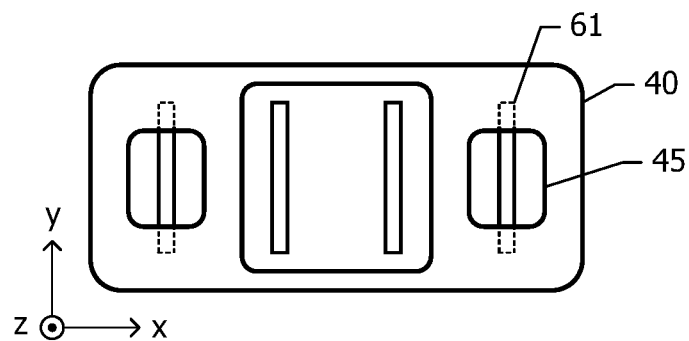
FIGS. 26B through 27B illustrate the positional relationships among a pillar bump, cavities, and operating regions of semiconductor apparatuses according to modified examples of the twelfth embodiment.

FIG. 26B illustrates the positional relationships among a pillar bump 40, cavities 45, and operating regions 61 of a semiconductor apparatus according to a modified example of the twelfth embodiment. In this modified example, the operating regions 61 other than those at both ends in the x-axis direction are entirely disposed within the cavity 45. Each of the operating regions 61 at both ends is partially disposed within the corresponding cavity 45 and is partially disposed outside the corresponding cavity 45.

In this modified example, the effect of reducing the thermal stress is exhibited in the operating regions 61 at both ends, while higher heat dissipation is achieved in the inner-side operating regions 61.

Figure 26C:
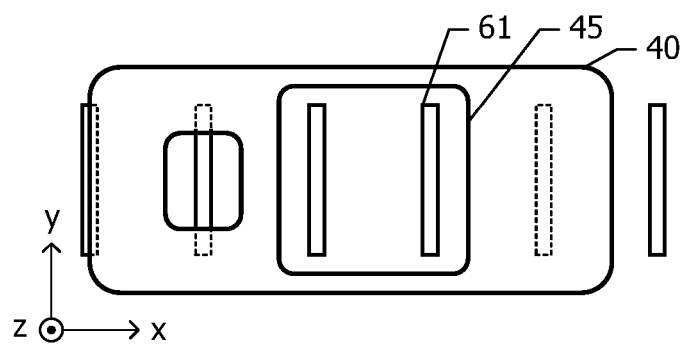

FIG. 26C illustrates the positional relationships among a pillar bump 40, cavities 45, and operating regions 61 of a semiconductor apparatus according to another modified example of the twelfth embodiment. In this modified example, some of the plural operating regions 61 are entirely disposed within the pillar bump 40. For the remaining operating regions 61, one is disposed outside the pillar bump 40, while one partially overlaps with the pillar bump 40. In this case, among the operating regions 61 entirely disposed within the pillar bump 40, the operating regions 61 positioned at both ends may be regarded as those at both ends shown in FIG. 26A or 26B.

Focusing on the plural operating regions 61 entirely disposed within the pillar bump 40, the positional relationship between the operating region 61 and the cavity 45 is the same as that in FIG. 26A or 26B. There may be an operating region 61 that is entirely disposed within the pillar bump 40 and is entirely disposed outside the cavity 45.

Figure 27A:
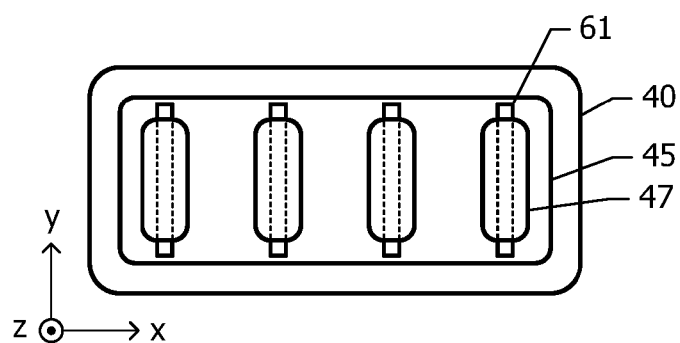

FIG. 27A illustrates the positional relationships among a pillar bump 40, a cavity 45, and operating regions 61 of a semiconductor apparatus according to another modified example of the twelfth embodiment. In this modified example, within the outer edge lines of the cavity 45, the portions 47 with the insulating film 52 (FIG. 3) (hereinafter called the insulating-film portions 47) are separately disposed. The insulating-film portions 47 are disposed in association with the operating regions 61. The insulating-film portions 47 overlap with the operating regions 61 except for both ends thereof. In this modified example, the insulating-film portions 47 overlap with the central portions of the operating regions 61, except for both ends thereof in the y-axis direction. The thermal stress is thus reduced in the central portions of the operating regions 61.

Figure 27B:
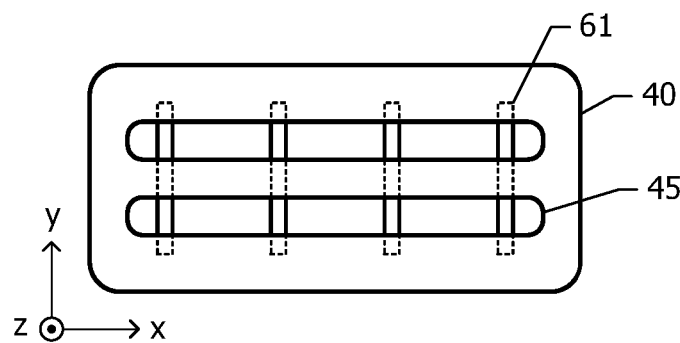

FIG. 27B illustrates the positional relationships among a pillar bump 40, cavities 45, and operating regions 61 of a semiconductor apparatus according to another modified example of the twelfth embodiment. In this modified example, plural (two, for example) cavities 45 are provided and each cover the area from the operating region 61 at one end to that at the other end in the x-axis direction. It is also possible to reduce the thermal stress produced in the operating regions 61 in this modified example.

As in the twelfth embodiment and modified examples thereof, at least one of plural operating regions 61 is entirely disposed within the pillar bump 40, as viewed from above. Among the operating regions 61 entirely disposed within the pillar bump 40, at least one operating region 61 is at least partially disposed outside the corresponding cavity 45.

The disclosure is not limited to the above-described embodiments and modified examples. The configurations described in some of the embodiments and modified examples may partially be replaced by or combined with each other. Similar advantages obtained by similar configurations in plural embodiments are not repeated in the individual embodiments.

While preferred embodiments of the disclosure have been described above, it is to be understood that variations, improvements, combinations, and modifications will be apparent to those skilled in the art without departing from the scope and spirit of the disclosure. The scope of the disclosure, therefore, is to be determined solely by the following claims.

What is claimed is:

1. A semiconductor apparatus comprising:
   a substrate;
   a plurality of unit transistors provided on the substrate, each of the plurality of unit transistors including an operating region through which an operating current flows;
   a first wiring disposed above the operating regions of the plurality of unit transistors to serve as a path for the operating current to flow through the plurality of unit transistors;
   an insulating film disposed on the first wiring and including at least one first cavity, an entirety of the at least one first cavity overlapping with the first wiring as viewed from above; and
   a first bump disposed on the insulating film and electrically connected to the first wiring via the at least one first cavity, wherein:
   as viewed from above, at least one of the operating regions is disposed within the first bump, and at least one region among the at least one of the operating regions disposed within the first bump is at least partially disposed outside a corresponding one of the at least one first cavity,
   the plurality of unit transistors are arranged side by side in one direction, and
   a proportion of an area of a portion of the operating regions disposed outside the first cavity is higher in two of the operating regions arranged at both ends of an arrangement direction of the plurality of unit transistors than in remaining ones of the operating regions arranged at other than the both ends among a plurality of the operating regions disposed within the first bump, as viewed from above.

2. The semiconductor apparatus according to claim 1, wherein a coefficient of thermal expansion of the insulating film is smaller than or equal to a coefficient of thermal expansion of the substrate, or a Young's modulus of the insulating film is lower than a Young's modulus of the substrate.

3. The semiconductor apparatus according to claim 2, further comprising:
   a second wiring disposed above the substrate;
   at least one second cavity, an entirety of the at least one second cavity overlapping with the second wiring as viewed from above; and
   a second bump disposed on the insulating film and electrically connected to the second wiring via the at least one second cavity,
   wherein a planar configuration of the at least one first cavity and a planar configuration of the at least one second cavity are substantially identical.

4. The semiconductor apparatus according to claim 3, wherein:
   the at least one first cavity includes a plurality of first cavities disposed at substantially equal intervals;
   the at least one second cavity includes a plurality of second cavities disposed at substantially equal intervals; and
   the interval between the plurality of first cavities and the interval between the plurality of second cavities are substantially equal to each other.

5. The semiconductor apparatus according to claim 2, wherein:
   the operating regions of the plurality of unit transistors have a planar configuration elongated in a direction perpendicular to an arrangement direction of the plurality of unit transistors.

6. The semiconductor apparatus according to claim 2, wherein the first bump forms a pillar bump including a metal post comprising copper as a main constituent.

7. The semiconductor apparatus according to claim 1, further comprising:
   a second wiring disposed above the substrate;
   at least one second cavity, an entirety of the at least one second cavity overlapping with the second wiring as viewed from above; and
   a second bump disposed on the insulating film and electrically connected to the second wiring via the at least one second cavity,
   wherein a planar configuration of the at least one first cavity and a planar configuration of the at least one second cavity are substantially identical.

8. The semiconductor apparatus according to claim 7, wherein:
   the at least one first cavity includes a plurality of first cavities disposed at substantially equal intervals;
   the at least one second cavity includes a plurality of second cavities disposed at substantially equal intervals; and
   the interval between the plurality of first cavities and the interval between the plurality of second cavities are substantially equal to each other.

9. The semiconductor apparatus according to claim 8, wherein:
   the operating regions of the plurality of unit transistors have a planar configuration elongated in a direction perpendicular to an arrangement direction of the plurality of unit transistors.

10. The semiconductor apparatus according to claim 1, wherein:
    the operating regions of the plurality of unit transistors have a planar configuration elongated in a direction perpendicular to an arrangement direction of the plurality of unit transistors.

11. The semiconductor apparatus according to claim 1, wherein the first bump forms a pillar bump including a metal post comprising copper as a main constituent.

12. The semiconductor apparatus according to claim 1, wherein the insulating film includes at least one of silicon oxide, silicon nitride, and a resin as a material.

13. The semiconductor apparatus according to claim 1, wherein:
    each of the plurality of unit transistors is a bipolar transistor including a collector layer, a base layer, and an emitter layer provided on the substrate; and
    the operating region is a region where the operating current flows in a thickness direction of each of the plurality of unit transistors.

14. The semiconductor apparatus according to claim 13, wherein:
    the collector layer, the base layer, and the emitter layer of each of the plurality of unit transistors are sequentially stacked on the substrate;
    the emitter layer is electrically connected to the first wiring; and
    an interface between the base layer and the emitter layer is a heterojunction.

15. The semiconductor apparatus according to claim 14, wherein the substrate comprises GaAs and the emitter layer comprises InGaP.

16. The semiconductor apparatus according to claim 14, wherein each of the plurality of unit transistors is a heterojunction bipolar transistor including the base layer comprising SiGe.

17. The semiconductor apparatus according to claim 1, wherein:
    each of the plurality of unit transistors is a field-effect transistor including a source, a drain and a gate provided on the substrate; and
    the operating region is a region where the operating current flows in an in-plane direction on a surface of the substrate.

* * * * *